(12) United States Patent
Gomm

(10) Patent No.: US 11,515,860 B2
(45) Date of Patent: Nov. 29, 2022

(54) DETERMINISTIC JITTER GENERATOR WITH CONTROLLABLE PROBABILITY DISTRIBUTION

(71) Applicant: Micron Technology, Inc., Boise, ID (US)

(72) Inventor: Tyler J. Gomm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/198,925

(22) Filed: Mar. 11, 2021

(65) Prior Publication Data

US 2022/0294428 A1   Sep. 15, 2022

(51) Int. Cl.
| | | |
|---|---|---|
| *H03K 3/017* | (2006.01) | |
| *H03K 3/037* | (2006.01) | |
| *H03K 19/20* | (2006.01) | |
| *H03K 5/01* | (2006.01) | |
| *G06F 1/10* | (2006.01) | |
| *H03K 3/84* | (2006.01) | |
| *G06F 7/58* | (2006.01) | |
| *H03K 5/00* | (2006.01) | |

(52) U.S. Cl.
CPC .............. *H03K 3/017* (2013.01); *G06F 1/10* (2013.01); *H03K 3/037* (2013.01); *H03K 3/84* (2013.01); *H03K 5/01* (2013.01); *H03K 19/20* (2013.01); *G06F 7/582* (2013.01); *H03K 2005/00078* (2013.01)

(58) Field of Classification Search
CPC .......... H03K 3/017; H03K 3/037; H03K 3/84; H03K 5/01; H03K 19/20; H03K 2005/00078; G06F 1/10; G06F 7/582

USPC .......................................................... 327/175
See application file for complete search history.

(56) References Cited

U.S. PATENT DOCUMENTS

| | | | |
|---|---|---|---|
| 6,774,687 B2 | 8/2004 | Gomm et al. | |
| 8,892,617 B2* | 11/2014 | Tzeng | H03L 7/0814 708/271 |
| 9,397,647 B2* | 7/2016 | Romano | H03K 5/133 |
| 10,373,671 B1* | 8/2019 | Gomm | H03K 5/13 |
| 10,523,223 B2* | 12/2019 | Yu | G06F 13/1668 |

(Continued)

OTHER PUBLICATIONS

C. Stroud. ECE 6250. Class Lecture, Topic: "Linear Feedback Shift Registers." Department of Electrical and Computer Engineering, Auburn University, Auburn, AL, Oct. 2004.

(Continued)

*Primary Examiner* — Ryan Jager
(74) *Attorney, Agent, or Firm* — Fletcher Yoder, P.C.

(57) ABSTRACT

A jitter generator may include a duty cycle code generator that generates a duty cycle control signal and an input buffer that outputs a signal based on its duty cycle. The input buffer may be coupled to the duty cycle code generator and to a source of a clock signal. After receiving the clock signal, the input buffer outputs the clock signal having jitter relative to the clock signal received from the source. The jitter may be added at least in part by components of the input buffer offsetting different transitions of the clock signal according to the duty cycle. Jitter may be added when the duty cycle changes in response to changes in the duty cycle control signal, such as in response to number generator circuitry of the duty cycle code generator update its output number, in response to a mode change received from a controller, or the like.

24 Claims, 16 Drawing Sheets

(56) References Cited

U.S. PATENT DOCUMENTS

| | | | |
|---|---|---|---|
| 2006/0285584 A1* | 12/2006 | Baumgartner | G01R 31/31709 375/226 |
| 2007/0276891 A1* | 11/2007 | Warner | G06F 1/025 708/277 |
| 2012/0025880 A1* | 2/2012 | Romano | H03L 7/08 327/156 |
| 2015/0035576 A1* | 2/2015 | Romano | H03K 5/133 327/262 |
| 2018/0254964 A1* | 9/2018 | Kwan | H04L 41/084 |

OTHER PUBLICATIONS

Maximum Integrated, "Pseudo-Random Number Generation Routine for the MAX765x Microprocessor," Application Note 1743 Sep. 2002.

\* cited by examiner

DETERMINISTIC JITTER GENERATOR WITH CONTROLLABLE PROBABILITY DISTRIBUTION

BACKGROUND

The present disclosure relates generally to memory devices and, more particularly, to generating jitter on transmitted clocking signals of the memory devices.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Generally, a computing system may include an electronic device that, in operation, communicates information via electrical signals. For example, a computing system may include a processor communicatively coupled to a memory device, such as a dynamic random-access memory (DRAM) device disposed on a dual in-line memory module (DIMM). In this manner, the processor may communicate with the memory device, such as to retrieve executable instructions, retrieve data to be processed by the processor, and/or store data output from the processor.

Over time, these electrical signals may degrade in quality, such as from aging of components of the electronic device. Degradation of electrical signals may increase a likelihood of clock jitter afflicting a system, where clock jitter corresponds to a clocking signal deviating from a target clocking pattern, such that a rising edge of a clocking signal (e.g., rising clock edge) occurs earlier than or later than a target rising edge time in an unpredictable pattern, which makes compensating for the jitter challenging. To facilitate improving operational reliability, performance of a memory device in response to extreme levels of clock jitter may be verified prior to finalization of manufacturing, such as by an external verification device. In some instances, an external verification device may perform diagnostics on operation of the memory device after a memory device has completed manufacturing, such as if a customer returns a memory device to a manufacturer or prior to a manufacturer shipping the memory device for sale. In some instances, operation of a memory device may be verified based on analysis of signals indicative of data input to and/or output from the memory device, but not on the basis of how the memory device is responding internally between sub-components of the memory device to the clock jitter. In other words, accuracy of operational monitoring may be affected by performing verification activities by using an external verification device to the memory device and/or computing device, which may be limited to the stages in a manufacturing process at which verification activities are performable by the external verification device. Furthermore, accuracy of operational monitoring may be affected by using jitter having unknown characteristics (i.e., resulting from uncontrollable jitter generation operations).

BRIEF DESCRIPTION OF THE DRAWINGS

Various aspects of this disclosure may better be understood upon reading the following detailed description and upon reference to the drawings in which.

DETAILED DESCRIPTION

Figure 1:
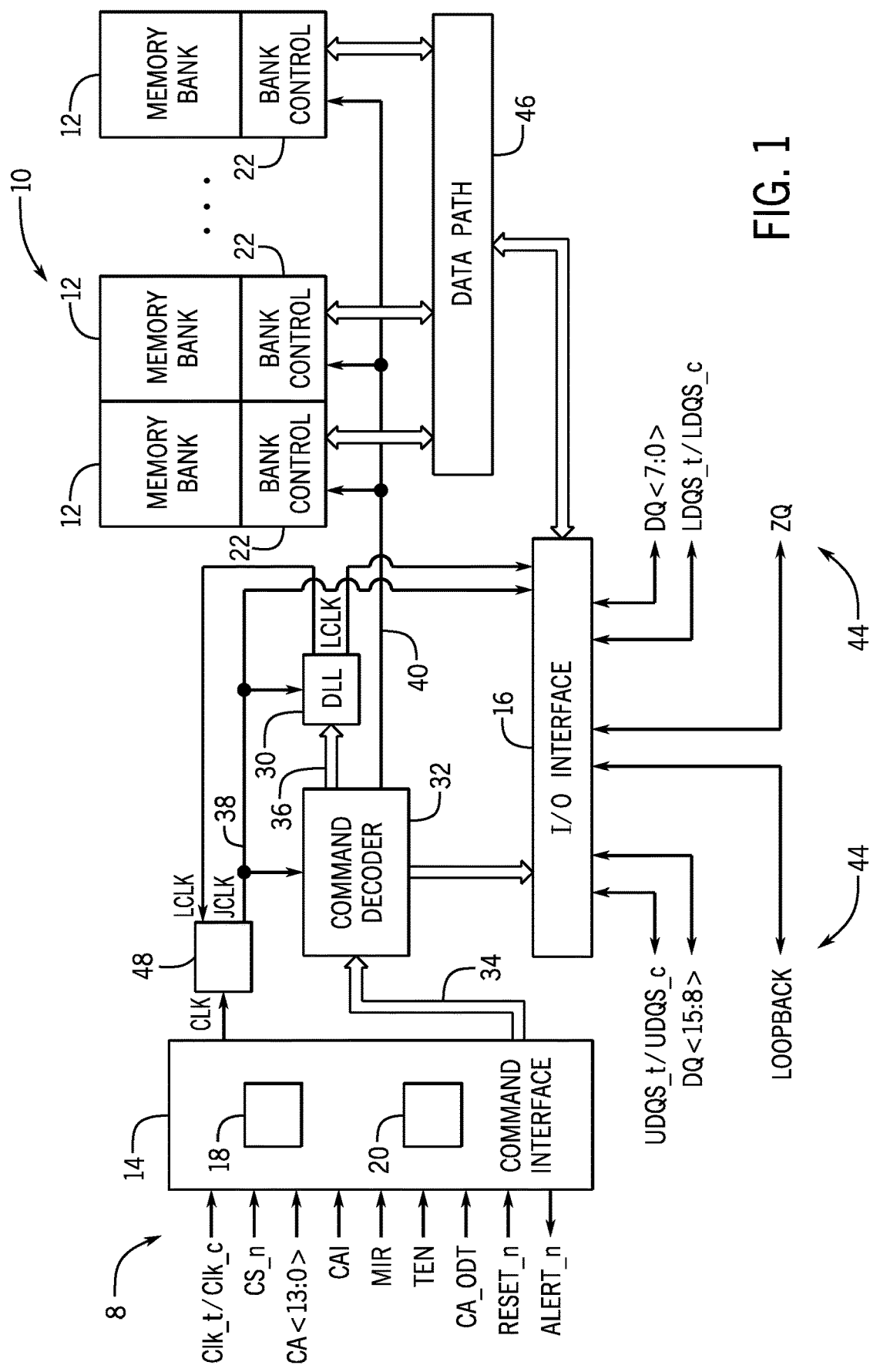
FIG. 1 is a block diagram of a memory device, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Generally, a computing system may include electronic devices that, in operation, communicate information via electrical signals. For example, electronic devices in a computing system may include a processor communicatively coupled to memory. In this manner, the processor may communicate with memory to retrieve executable instructions, retrieve data to be processed by the processor, store data output from the processor, or any combination thereof.

Over time, these electrical signals may degrade due to timing differences and component aging. As aging occurs, jitter may be introduced to one or more clocking signals of the computing system. Electronic devices may be sensitive to clock jitter and thus clock jitter may affect performance of the electronic devices in unpredictable ways unless performance of the electronic device is verified to respond in a particular way to clock jitter.

Electronic device performance in response to clock jitter may be verified using an external verification device. The external verification device may generate a clock signal with jitter and may apply the clock signal with jitter to one or more electronic devices of the computing system prior to inclusion in the computing system and/or may apply the jitter to the computing system as a whole. Complications may arise from using the external verification device to verify an electronic device of the computing system while the electronic device is installed in the computing device since the electronic device may be inaccessible to coupling to the external verification device.

To facilitate improving operational reliability of electronic devices, the present disclosure provides an on-die jitter generator in an electronic device, such as a memory device, to create jitter on a selected clocking signal to verify the behavior of the electronic device to an amount of clock jitter. Through use of an on-die jitter generator, the memory device may remain internal to the computing device during verification activities and thus performance of the memory device may be evaluated before, during, and after deployment of the memory device in the computing device (e.g., various stages of silicon validation associated with semiconductor integrated circuit development) and/or before, during, and after customer use of a computing device (e.g., debugging a computing device to a manufacturer after customer-purchase and/or customer-use). A jitter generator included on the memory device may receive a selected clocking signal, use the selected clocking signal to generate a random number, use the selected clocking signal to create a delayed clocking signal, and use the random number, the delayed clocking signal, and the selected clocking signal as inputs to a phase mixer to randomly mix the selected clocking signal and the delayed clocking signal together to create an output clocking signal with jitter. In some embodiments, additional capacitors, such as variable capacitance capacitors, and/or additional variable delay circuitry may be used in combination with mode selection signals to permit programming of a distribution generated by the on-die jitter generator. It is noted that through methods and systems described, any suitable clocking signal (e.g., clock signal) associated with an electronic device may be used to create a clocking signal with jitter.

The on-die jitter generator described above may generate jitter according to a Gaussian distribution with a programmable peak-to-peak jitter. A linear feedback shift register (LFSR) or suitable random number generator may be used to create the jitter. A deterministic jitter (Dj) value may be determined directly from oscilloscope analysis, or other suitable scoping or modeling analysis, based on a known length of the LFSR. However, the on-die jitter generator may not be able to generate a Gaussian distribution with a controllable root-mean square (RMS) value, where RMS values are sometime referred to as standard deviation values. Thus, a random jitter (Rj) of the jitter is unable to be verified when the RMS value of jitter is uncontrollable.

Some validation tests confirm using Rj values that a RMS of jitter is approximately 0.4 picoseconds (ps) (e.g., a value between 0.3 ps and 0.5 ps, a value less than 0.6 ps), though some validation tests request RMS values as low as possible. Some validation tests use a multiplier (e.g., 0.002, 0.003, any suitable multiplier) to scale a unit interval (UI) of the jitter to determine a suitable RMS value for the validation test (e.g., multiplier*UI=RMS value for validation testing). It is noted that a UI of a clocking signal corresponds to a period of time between a corresponding pair of rising and falling edges of a clocking signal, which making a respective signal pulse or clocking pulse (e.g., clocking transition) of the clocking signal. A RMS value of an output clock signal helps identify differences between respective UI of an output clock signal to help characterize jitter of the output clock signal.

As described, additional circuitry may be included in an integrated circuit, such as the one described above to control peak-to-peak values of jitter or any suitable jitter generator, to generate an output signal having jitter characterized with at least a controllable RMS value. This additional circuitry may sum and/or average one or more bits output from a number generator (e.g., random number generator, LFSR) to control a duty cycle of an input buffer of the jitter generator. Changes to the duty cycle may cause selective characteristic changes of the jitter, such as by offsetting respective clocking transitions of the output signal so over time the relative offset between each clocking transition forms a jitter distribution having a RMS value. Thus, controlling changes in the duty cycle of the input buffer may also control a RMS value of the jitter (e.g., distribution of timing changes identified as signal jitter within a resulting signal).

Generating jitter having a controllable RMS value may permit additional verification operations to occur, such as testing to verify a Rj value of jitter. Furthermore, generating jitter having a controllable RMS value increases a customizability of jitter, permitting design of jitter for performance of a specific operation or test. Other uses for jitter may also benefit from customizable jitter, and thus the systems and methods described may apply to other operations in addition to improving memory device validation operations.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM may permit reduced power consumption, more bandwidth, and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMs). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16 configured to exchange (e.g., receive and transmit) signals with external devices. The command interface 14 is configured to provide a number of signals (e.g., signals 8 from an external device (not depicted), such as a processor or controller. The processor or controller may provide various signals 8 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to permit proper handling of the signals 8. The command interface 14 may receive one or more clock signals from an external device. Generally, double data rate (DDR) memory utilizes a differential pair of system clock signals, referred to as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal locked clock signal LCLK based on the received internal clock signal CLK. The phase controlled internal locked clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal locked clock signal LCLK. The phase controlled internal locked clock signal LCLK may be used to clock data through the I/O interface 16, for instance.

The command decoder 32 may decode commands, such as read commands, write commands, mode-register set commands, activate commands, or the like, and provide access to a particular memory bank 12 corresponding to the command via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other operations, such as timing control and data control, to facilitate the execution of commands to and from the memory banks 12. Collectively, the memory banks 12 and the bank control blocks 22 may be referred to as a memory array.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal causes the memory device 10 to process commands on the incoming CA<13:0> bus. Access to specific memory banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they may be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the data bus 46, which includes a plurality of bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for a ×16 memory device, the I/O signals may be divided into upper and lower I/O signals (e.g., DQ<15:8> and DQ<7:0>) corresponding to upper and lower bytes of the data signals, for instance.

To permit higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the I/O interface 16. The loopback signal may be used during a test or debugging phase to set the memory device 10 into a mode where signals are looped back through the memory device 10 through the same pin. For instance, the loopback signal may be used to set the memory device 10 to test the data output of the memory device 10. Loopback may include both a data and a strobe, or possibly a data pin to provide the data and/or the strobe. This is generally intended to be used to monitor the data captured by the memory device 10 at the I/O interface 16.

Various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

In some embodiments, the memory device 10 may be disposed in (physically integrated into or otherwise connected to) a host device or otherwise coupled to a host device. The host device may include any one of a desktop computer, laptop computer, pager, cellular phone, personal organizer, portable audio player, control circuit, camera, or the like. The host device may also be a network node, such as a router, a server, or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, a medical device, or the like. The terms used to describe these various examples of systems, like many of the other terms used herein, may share some referents and, as such, should not be construed narrowly in virtue of the other items listed.

Thus, the host device may generally be a processor-based device, which may include a processor, such as a microprocessor, that controls the processing of system functions and requests in the host device. Further, any host processor may include multiple processors that share system control. The host processor may be coupled directly or indirectly to additional system elements of the host device, such that the host processor controls the operation of the host device by executing instructions that may be stored within the host device or external to the host device.

As discussed above, data may be written to and read from the memory device 10, such as by the host device whereby the memory device 10 operates as volatile memory, such as Double Data Rate DRAM (e.g., DDR5 SDRAM). The host device may, in some embodiments, also include separate non-volatile memory, such as read-only memory (ROM), PC-RAM, silicon-oxide-nitride-oxide-silicon (SONOS) memory, metal-oxide-nitride-oxide-silicon (MONOS) memory, polysilicon floating gate based memory, and/or other types of flash memory of various architectures (e.g., NAND memory, NOR memory, etc.) as well as other types of memory devices (e.g., storage), such as solid state drives (SSD's), MultimediaMediaCards (MMC's), SecureDigital (SD) cards, CompactFlash (CF) cards, or any other suitable device. Further, it should be appreciated that the host device may include one or more external interfaces, such as Universal Serial Bus (USB), Peripheral Component Interconnect (PCI), PCI Express (PCI-E), Small Computer System Interface (SCSI), IEEE 1394 (Firewire), or any other suitable interface as well as one or more input devices to permit a user to input data into the host device, such as by using buttons, switching elements, a keyboard, a light pen, a stylus, a mouse, and/or a voice recognition system. The host device may optionally also include an output device, such as a display coupled to the processor and a network interface device, such as a Network Interface Card (NIC), for interfacing with a network, such as the Internet. As will be appreciated, the host device may include many other components, depending on the application of the host device.

The host device may operate to transfer data to the memory device 10 for storage and may read data from the memory device 10 to perform various operations at the host device. Accordingly, to facilitate these data transmissions, in some embodiments, the I/O interface 16 may include a data transceiver that operates to receive and transmit DQ signals to and from the I/O interface 16.

During manufacturing of the memory device 10, an external verification device may operate to perform verification activities to test the memory device 10, such as before installing the memory device 10 in a host device. The verification activities may confirm that the memory device 10 meets various manufacturing specifications, such as through testing behavior of internal components of the memory device when exposed to signal jitter. In some embodiments, it may be useful to include a jitter generator 48 inside the memory device 10 to replace and/or supplement usage of the external verification device. By including the jitter generator 48 in the memory device 10, the host device may perform verification activities while the memory device 10 is otherwise inaccessible by the external verification device, such as, at a later stage in a manufacturing process.

Using a jitter generator 48 in the memory device 10 may improve validation techniques since the jitter generator 48 enables validation of the memory device 10 at an increased number of stages during and after the manufacturing processes, for example, at a stage where the memory device 10 is accessible via an external verification device and at a stage where the memory device 10 is inaccessible via the external verification device. Through use of a jitter generator 48, the memory device 10 may remain internal to the host device for verification activities and thus performance of the memory device 10 may be evaluated before, during, and after deployment of the memory device 10 in the host device and/or before, during, and after customer use of a host device.

As a method of verifying memory device 10 performance, the jitter generator 48 may operate to create clock jitter on an existing clock signal of the memory device 10, for example, the internal clock signal CLK and/or the phase controlled internal locked clock signal LCLK. As depicted, the jitter generator 48 receives the internal clock signal CLK and/or the phase controlled internal locked clock signal LCLK. Also as depicted, the jitter generator 48 outputs a clock signal with added jitter (JCLK) via path 38 to the command decoder 32, the internal clock generator 30, and/or the I/O interface 16. It should be understood that the jitter generator 48 may operate in a variety of operational modes to transmit different jitter signals to different components based on different starting clocks. For example, the jitter generator 48 may operate in a first operational mode to transmit the internal clock signal CLK with jitter to the command decoder 32 as JCLK, and, at a different time, the jitter generator 48 may operate in a second operational mode to transmit the phase controlled internal locked clock signal LCLK with jitter to the internal clock generator 30 as JCLK. In some embodiments, the jitter generator 48 may operate in a pass-through mode to enable the internal clock signal CLK and/or the phase controlled internal locked clock signal LCLK to pass-through without having jitter added to the clock signal by the jitter generator 48. In this way, for example, a jitter generator 48 operating in a pass-through mode may receive the internal clock signal CLK and transmit the internal clock signal CLK to the command decoder 32 without jitter being added to the internal clock signal CLK. The command interface 14, and/or a controller or processing circuitry of the host device, may instruct the jitter generator 48 to operate in at least these described operational modes.

Figure 2:
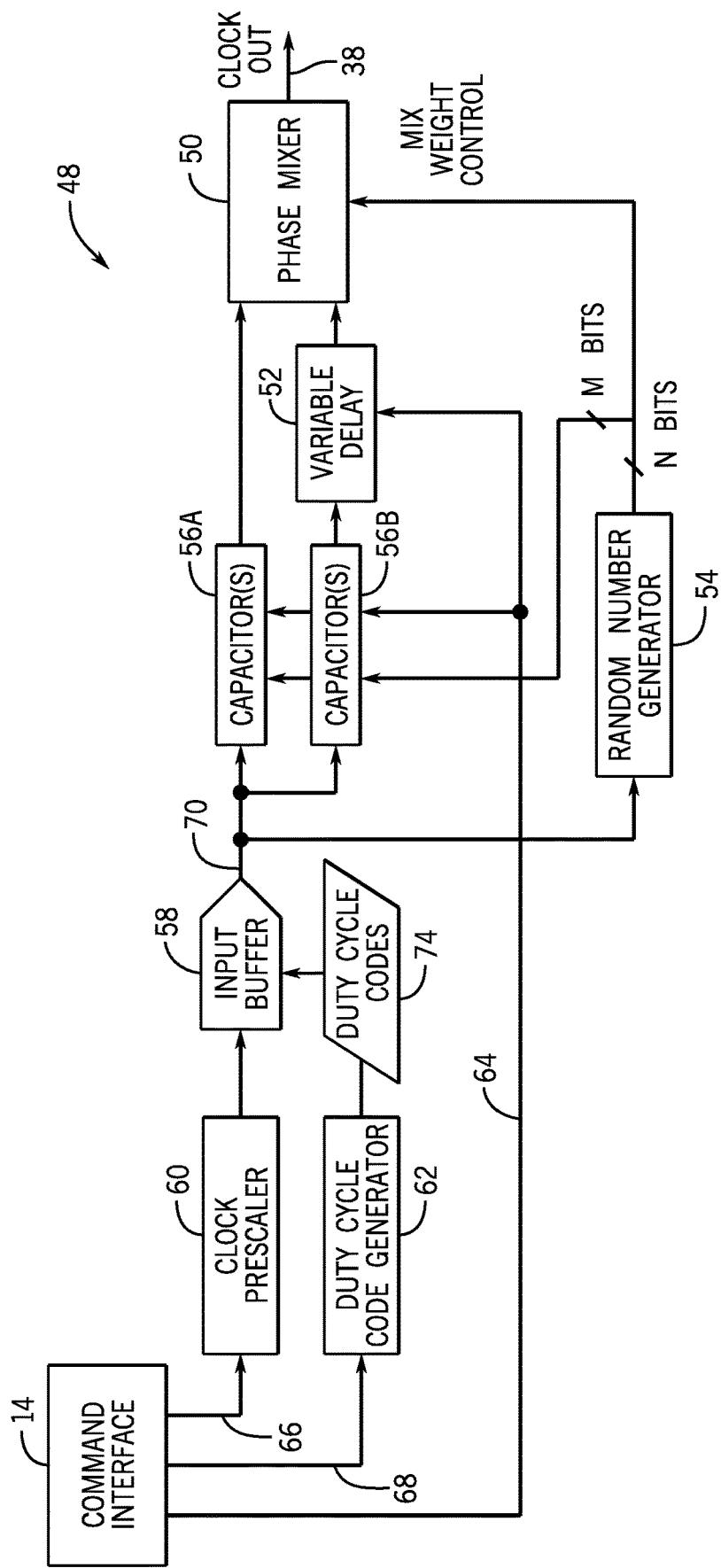
FIG. 2 is a block diagram of a jitter generator of the memory device of FIG. 1 including a duty cycle code generator, in accordance with an embodiment.

To help illustrate, FIG. 2 depicts an example of a jitter generator 48 that receives, via path 66, a Clock In signal (e.g., clock input signal, any suitable clock signal of an electronic device, an internal clock signal CLK, a phase controlled internal locked clock signal LCLK) from the command interface 14. The jitter generator 48 may adjust the Clock In signal using inter-disposed circuitry operated in response to control signals (i.e., mode selection signals, mode signals) transmitted from the command interface 14 to respective inter-disposed circuitry and a generated Mix Weight Control signal of N bits. The jitter generator 48 may transmit a Clock Out signal (e.g., a clock output signal via path 38 as the JCLK) having a programmed type of jitter based on the combination of respectively generated outputs from each of the inter-disposed circuitry. The jitter generator 48 includes a phase mixer 50, a variable delay block 52, a random number generator 54, capacitors 56 (56A, 56B), an input buffer 58, a clock prescaler 60, and a duty cycle code generator 62. Although presented as a full device, it is noted that subsets of the circuitry may operate in a device independent of the others to generate a signal with jitter. For example, the duty cycle code generator 62 and the input buffer 58 may be included in a jitter generator without the random number generator 54, the capacitors 56, and/or the variable delay 52. This example jitter generator that excludes certain circuitry may output a signal with jitter having a controllable RMS value, and may output the signal to downstream circuitry, such as a command decoder, a delay locked loop (DLL), an input/output (I/O) interface, or the like.

It should be appreciated that the depicted jitter generator 48 is merely intended to be illustrative and not limiting, and certain jitter generators 48 may include different or additional circuitry to the duty cycle code generator 62 and the input buffer 58. For example, in some embodiments, the jitter generator 48 may receive two clock signals, like an internal clock signal CLK and a phase controlled internal locked clock signal LCLK, and thus include additional circuitry to process both clock signals in parallel and/or to toggle between processing of the clock signals. It is noted that the Clock Out signal may be transmitted to a circuit of an electronic device, for example, a command decoder 32, an I/O interface 16, and/or an internal clock generator 30 (e.g., delay locked loop (DLL)), such as the JCLK of FIG. 1. Additionally or alternatively, it is noted that the variable delay block 52 may be referred to as a delay block or delay-causing circuitry. Thus, it should be understood that the variable delay block 52 and future references to components causing delays may be considered circuitry that adds signal delay, sequential and/or combinational logic circuitry that causes delay, or delay-causing circuitry. Any suitable amount of delay may be used and sometimes a delay block applying a constant amount of delay may be used.

After receiving the Clock In signal, the clock prescaler 60 adjusts the Clock In signal. For example, the clock prescaler 60 may modify (e.g., increase, decrease) an amplitude of the Clock In signal before the Clock In signal is transmitted to the input buffer 58. The clock prescaler 60 may perform any suitable processing operation of the Clock In signal to generate an adjusted clock output to be received downstream by the input buffer 58. Other processing may include a phase adjustment, an inversion, or the like. It is noted that, in some cases, the adjustment made by the clock prescaler 60 to the Clock In signal adjusts the signal by a factor of 1 (e.g., may not be adjusted).

The input buffer 58 may receive the Clock In signal (e.g., not adjusted, adjusted by a factor of 1) or an adjusted Clock In signal (e.g., adjusted by a factor different from 1) from the clock prescaler 60. The input buffer 58 has a tunable duty cycle. Duty cycle is a ratio of a time that a clock signal is a voltage value corresponding to logical high compared to a time that the clock signal is a voltage value corresponding to logical low. Thus, by changing a duty cycle while transmitting the Clock In signal (or adjusted Clock In signal) via the input buffer 58, jitter may be added to an output, transmitted via path 70, from the input buffer 58. Adjusting the duty cycle by known amounts may improve predictability and enables verification of an Rj value of a resulting Clock Out signal transmitted, via path 38, from the jitter generator 48 and/or transmitted, via path 70, from the input buffer 58.

The duty cycle of the input buffer 58 may be tuned by an output from the duty cycle code generator 62, such as duty cycle codes 74 (e.g., duty cycle control signal). To do so, a controller (e.g., a memory controller) transmits an operational mode control signal (e.g., mode signal 88 of FIG. 3) to the command interface 14, for example, in response to determining to perform verification operations on the memory device 10 or to perform another operation that uses signals with jitter. The command interface 14 may transmit, via path 68, the operational mode control signal and the input clock signal (or a system clock signal) to the duty cycle code generator 62. The duty cycle code generator 62 may use the inputs to generate the duty cycle control signal. The input buffer 58 receives the Clock In signal from the command interface 14 and receives the duty cycle control signal from the duty cycle code generator 62. The duty cycle control signal may be received before the Clock In signal or after receiving one or more transitions of the Clock In signal—in this way, the duty cycle control signal may be a first programming signal transmitted to the input buffer 58 or a subsequent programming signal used to update or adjust operation of the input buffer 58. In response to receiving the duty cycle control signal, the input buffer 58 adjusts its operation to offset clocking transitions. Repeatedly doing this adjustment over time may output a clock signal with jitter relative to an input clock signal. Thus, when the input buffer 58 outputs the adjusted Clock In signal via path 70, the input buffer 58 outputs the Clock In signal with added jitter.

The adjusted Clock In signal is received by the capacitors 56 and the random number generator 54. The random number generator 54 operates to output a random number of N bits in response to transitions in the adjusted Clock In signal. While it should be understood that the random number generator 54 may be any suitable random number generator that operates to output a random number of N bits, an example of a suitable random number generator 54 may be a linear-feedback shift register including flip-flops and an exclusive-OR (XOR) gate. The random number generator may include N-number of flip-flops and a suitable number of XOR gates to generate a random number output of size N bits (e.g., one XOR gate). M bits, as a subset of the N bits, are transmitted as a control signal to the capacitors 56. This electrical coupling and/or decoupling serves to respectively change an overall capacitance value of the capacitors 56. In this way, the capacitors 56 may be variable capacitors whose values changes in response to the control signal, for example, through switches changing state in response to the M bits control signal and/or in response to the Mode Selection signal.

The jitter generator 48 may receive two or more signals indicative of an operational mode for the variable delay block 52 (e.g., Mode Selection signal via path 64) and/or the capacitors 56, where different operational modes may cause different amounts of delay to the delayed Clock In signal. The Mode Selection signal is a control signal transmitted from a host device to the jitter generator 48 for the purpose of changing signal characteristics, for example, a peak-to-peak value of the jitter of the Clock Out signal transmitted from the jitter generator 48. In addition, the Mode Selection signal may enable or disable (e.g., cause bypassing of) the capacitors 56, such that the M bits control signal is unable to electrically couple and/or electrically decouple the capacitors 56.

The variable capacitance value of the capacitors 56 may further modulate phases of the Clock In signal prior to transmission of the Clock In signal to the phase mixer 50 and/or the variable delay block 52 to generate additional jitter on the inputs to the phase mixer 50. The Mode Selection signal may enable and/or disable one or more of the capacitors 56, set a delay of the variable delay block 52, or both. For example, in response to an increase in delay caused by the variable delay block 52, the Mode Selection signal may be used to enable additional capacitors of the capacitors 56 to improve gaps in the Clock Out signal jitter distribution (e.g., fill in values of the jitter distribution). Thus, through selecting one or more values for the capacitors 56, selecting a duty cycle of the input buffer, selecting a delay value to be applied through the variable delay block 52, and changing which values are received as the Mix Weight Control signal, or any combination thereof, a jitter distribution may be designed.

The variable delay block 52 delays the Clock In signal, such that a rising edge of the delayed Clock In signal occurs at a point later in time than the corresponding rising edge of the Clock In signal. The variable delay block 52 may be any suitable delay causing circuitry, for instance, combinational logic (e.g., one or more not-AND (NAND) logic gates, one or more not-OR logic gates (NOR), one or more OR logic gates, one or more AND logic gates, one or more XOR gates, one or more inverter logic gates, one or more delay blocks, or any combination thereof) that acts to delay an input signal based on switching delays between states of the combinational logic. The delay of the delayed Clock In signal (e.g., the signal output from the variable delay block 52) may correspond to a fraction of a respective unit interval (UI) (e.g., 0.4*UI), a multiple of a respective UI (e.g., 5.0*UI), a constant delay applied to one or more clocking transitions (e.g., 0.2*UI, 2.6*UI, 7.0*UI), no delay amount applied to one or more clocking transitions (e.g., 1.0*UI), any suitable delay amount applied to any number of clocking transitions, or any combination thereof relative to the Clock In signal. After delaying the Clock In signal, the variable delay block 52 transmits the delayed Clock In signal to the phase mixer 50.

The phase mixer 50 randomly mixes two phases of the Clock In signal through using a Mix Weight Control signal of N bits corresponding to a random number generated by the random number generator 54 based in part on the Clock In signal. In some embodiments, each bit of the random number corresponds to a sub-signal of the Mix Weight Control signal of N bits (e.g., the N bits are transmitted in parallel to the phase mixer 50). The phase mixer 50 may use logic circuitry responsive to the Mix Weight Control signal of N bits to electronically average the Clock In signal and a delayed Clock In signal to create a Clock Out signal inclusive of the Clock In signal with additional jitter. In this way, the phase mixer 50 may slow or advance one or more clocking intervals, such that a subset of unit intervals of a subset of the clocking intervals are offset in time from at least another subset of unit intervals of a different subset of the clocking intervals. In some embodiments, additional control signals may be transmitted by a host device to the jitter generator 48 to change a transmission destination of the Clock Out signal, such as to transmit to a command decoder 32, an I/O interface 16, and/or an internal clock generator 30.

Figure 3:
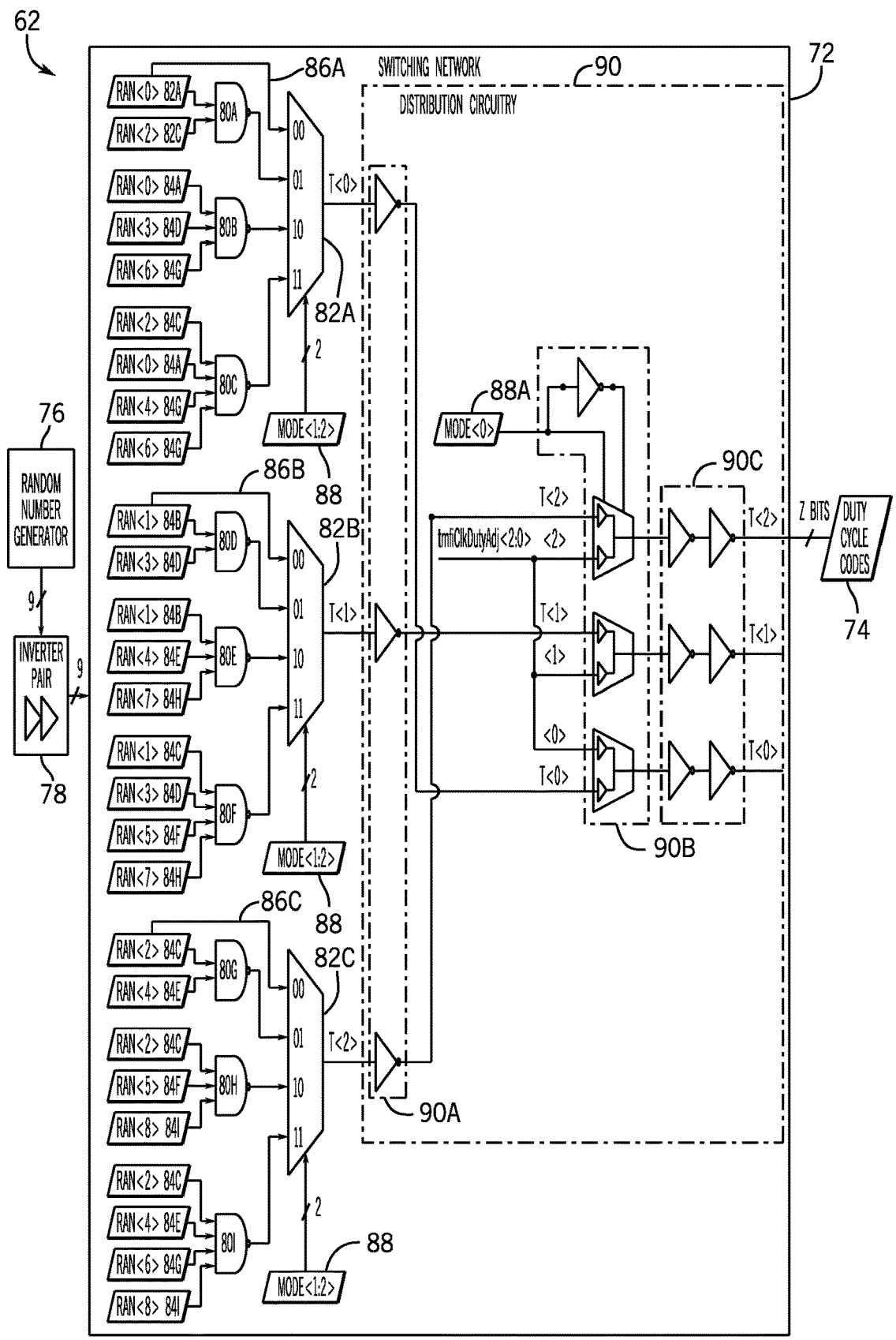
FIG. 3 is a block diagram of the duty cycle code generator of FIG. 2, in accordance with an embodiment.

An example of circuitry that could be included as the duty cycle code generator 62 is depicted in FIG. 3. FIG. 3 depicts an example embodiment of the duty cycle code generator 62. The duty cycle code generator 62 includes a random number generator 76, inverter pairs 78, and a switching network 72. The switching network 72 may generate one or more duty cycle codes 74 for transmission to the input buffer 58 based on combinations of outputs from the random number generator 76.

The random number generator 76 may output binary sequences according to a pseudo-random numbering sequence. Indeed, the outputs (e.g., binary numbers that output according to a pseudo-random numbering sequence) from the random number generator 76 are combined and processed to form the duty cycle codes 74 based on the switching network 72 and an operation of multiplexing circuitry (MUXs) 82.

The operation of the MUXs 82 determine which subset, or which subset of the combinations, of the outputs from the random number generator 76 are to be transmitted as the duty cycle codes 74. An example of embodiment of the random number generator 76 as a linear feedback shift register is depicted in FIG. 4, which will be discussed briefly below.

Figure 4:
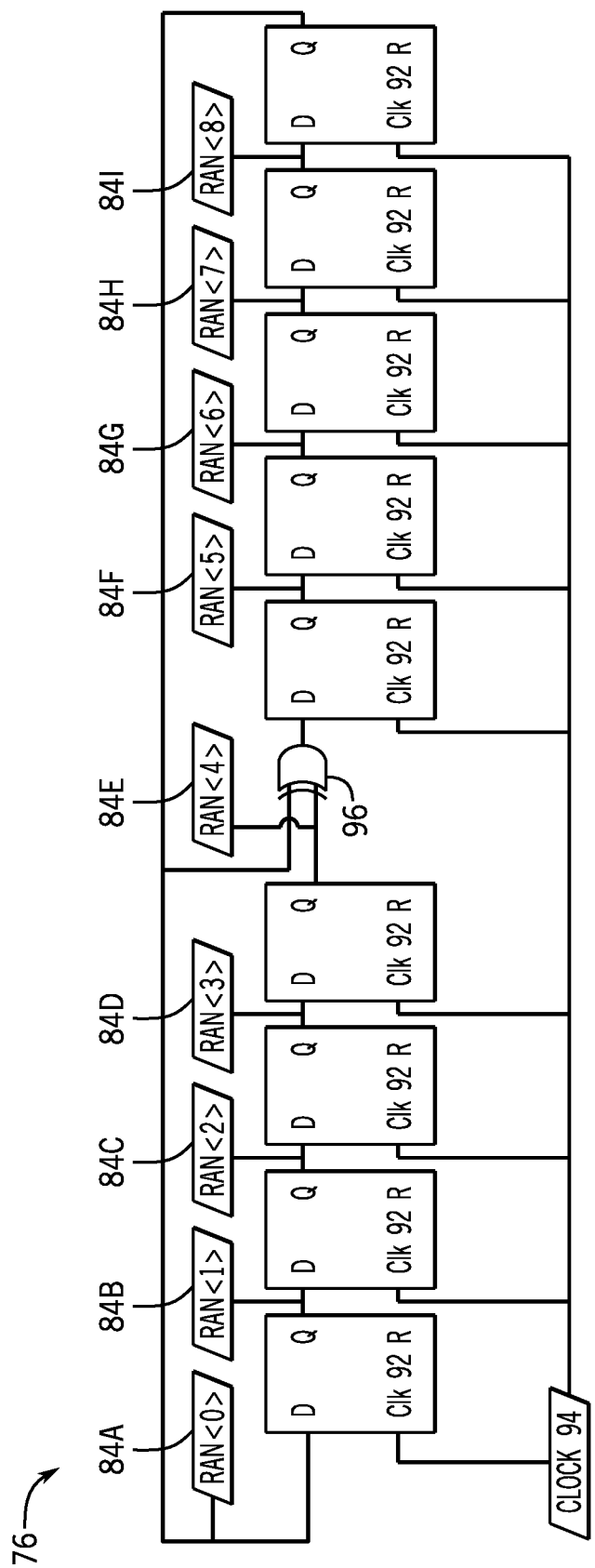
FIG. 4 is a block diagram of a random number generator of the duty cycle code generator of FIG. 2, in accordance with an embodiment.

FIG. 4 depicts an example random number generator 76 that includes 9 flip-flops 92 and an exclusive-OR gate 96 arranged and inter-coupled to provide a linear feedback shift register. It should be noted that any suitable number of flip-flops may be used in an actual deployment of a linear feedback shift register and that the downstream logic gates 80 may be scaled accordingly to process a different number of outputs from the random number generator 76. The random number generator 76 generates a 9-bit number that updates in response to each transition in the clock signal 94 to output sequences of values in a seemingly random sequence of values (i.e., pseudo-random sequence), such as in response to a rising edge of the clock signal 94. Indeed, the output of the random number generator 76 changes in response to a rising or falling clock signal edge, and thus a change in the pseudo-random number output triggers a change in the duty cycle codes 74 output from the duty cycle code generator 62. The 9-bit number is represented by each of the pseudo-random output signals (RAN<0:8>), which include binary data (e.g., logical low or logical high voltage values interpreted as binary data) generated by the random number generator 76. The flip-flops 92 may be initialized to a non-zero state (e.g., "101010101" or any suitable binary sequence) via a reset signal (not illustrated) to the "R" input. For example, all but one flip-flop 92 may be initialized to a logical high, "1," corresponding to a non-zero starting number for the random number generator 76.

As the clock signal 94 clocks the flip-flops 92, the random number generator 76 changes state and counts in a pseudo-random order, or a non-sequential order, where sequential refers to a traditional counting order (e.g., 1-2-3-4 . . . , 9-8-7-6, and the like). This non-numerically sequential, or pseudo-random, binary counting order may lead to, for example, a binary number for "5" not following a binary number for "4". In general, a total number of binary state outputs of a linear feedback shift register follows a $2^N-1$ relationship to account for not outputting a binary state of all logical lows (e.g., binary representation of zero), where N is a number of flip-flops 92. When N=9, a linear feedback shift register with the 9 flip-flops 92 may output a total of 511 binary states in a pseudo-random counting order.

For sake of comparison, it is noted that binary counting order usually progresses in a numerically sequential order, such as 000000000, 000000001, 000000010, 000000011, . . . 111111111. However, since the random number generator 76 counts in a pseudo-random order, the next number of the counting sequence may not be the same as an expected next number following binary counting in the numerically sequential order. It is also noted that although described as a system clocking signal, the clock signal 94 in some cases is the same or a substantially similar clock signal as the clock signal output from the command interface 14 to the input buffer 58.

Although the random number generator 76 is described by FIG. 4, it is noted that the random number generator 54 of FIG. 2 may, in some cases, include an additional linear feedback shift register that operates similar to the linear feedback shift register of FIG. 4 to generate N bits output used as the Mix Weight Control signal and the M bits control signal. Since final signal characteristics of the Clock Out signal from the jitter generator 48 may be based at least in part on the clock rate of the random number generators 54, 76, a rate at which the random number generators 54, 76 are clocked may determines the jitter rate of the Clock Out signal.

Returning to FIG. 3, the random number bits output from the random number generator 76 are transmitted through the inverter pair 78 to respective inputs of logic gates 80 (80A, 80B, 80C, 80D, 80E, 80F, 80G, 80H, 80I) of the switching network 72. The inverter pair 78 may delay the output from the random number generator 76 before the output reaches the switching network 72, and thus operate as delay-causing circuitry. The inverter pair 78 may add an amount of delay to the outputs, such as to align timing with overall device timing. In some cases, the inverter pair 78 may be able to add a variable amount of delay to the output before transmitted the output to the switching network 72 in response to control signals from the command interface 14 and/or in response to programming at manufacturing.

The switching network 72 receives the outputs from the inverter pair 78 and distributes the outputs to various logic gates 80 and/or combinational logic circuitry. The logic gates 80 are illustrated as NAND gates, but it should be understood that other combinational logic may be used. Logic outputs from the random number generator 76 are compared at respective logic gates 80 to generate outputs transmitted to respective of multiplexers (MUX) 82 (82A, 82B, 82C). For example, input RAN <0> 84A and input RAN <2> 84C are combined through NAND logic gate 80A to generate an output to MUX 82A. The input RAN <0> 84A is also transmitted directly to MUX 82A via bypass path 86A.

Other combinational results are transmitted to MUX 82A, MUX 82B, and MUX 82C. These results may arrive at each of the MUXs 82 at a substantially similar or same time. The mode signal 88 selects between one of the four inputs to MUXs 82 to output to inverters 90A of distribution circuitry 90. In this way, the mode signals 88 set an operational mode of the duty cycle code generator 62. For example, the mode signals 88 change what operational mode the switching network 72 uses to generate the duty cycle codes 74 for operating the input buffer 58. Thus, the duty cycle code generator 62 generates the duty cycle codes 74 based on the operational mode set by the mode signals 88.

When the mode signals 88 have a first state (e.g., Mode<0:2>=100), the duty cycle codes 74 are generated using one or more less significant bits (e.g., RAN<0:2>, RAN<0> is the least significant bit) and the duty cycle code generator 62 may be considered to be operated in a bypass mode. In the first state, the input buffer 58 may output jitter having a uniform jitter distribution, as elaborated on below with Table 1 and FIGS. 6A and 6B. When the mode signals 88 have a second state (e.g., Mode<0:2>=101), the duty cycle codes 74 are generated using a binary addition mode that operates to compare two respective bits output from the random number generator 76. In the second state, the input buffer 58 may output jitter having a Gaussian jitter distribution, as elaborated on below with Table 1 and FIGS. 7A and 7B. When the mode signals 88 have a third state (e.g., Mode<0:2>=110), the duty cycle codes 74 are generated using a binary addition mode that operates to compare three respective bits output from the random number generator 76. In the third state, the input buffer 58 may output jitter having a Gaussian jitter distribution, as elaborated on below with Table 1 and FIGS. 8A and 8B. Furthermore, when the mode signals 88 have a fourth state (e.g., Mode<0:2>=110), the duty cycle codes 74 are generated using a binary addition mode that operates to compare four respective bits output from the random number generator 76. In the fourth state, the input buffer 58 may output jitter having a Gaussian jitter distribution, as elaborated on below with Table 1 and FIGS. 9A and 9B. The Gaussian jitter distributions generated with the second, third, and fourth states may have different root-mean-square values relative to each other.

Elaborating further, input RAN <0> 84A, input RAN <3> 84D and input RAN <6> 84G are combined through the NAND logic gate 80B to generate an output to the MUX 82A. The input RAN <2>, input RAN <0> 84A, input RAN <4> 84E, and input RAN <6> 84G are combined through the NAND logic gate 80C to generate another output to the MUX 82A.

Additional inputs are similarly combined for MUX 82B and MUX 82C. Indeed, input RAN <1> 84B and input RAN <3> 84D are combined through the NAND logic gate 80D to generate an output to the MUX 82B. The input RAN <1> is also transmitted directly to the MUX 82B via bypass path 86B. The input RAN <1> 84B, input RAN <4> 84E and input RAN <7> 84H are combined through the NAND logic gate 80E to generate an output to the MUX 82B. The input RAN <1> 84B, input RAN <3> 84D, input RAN <5> 84F, and input RAN <7> 84H are combined through the NAND logic gate 80F to generate another output to the MUX 82B. The mode signal 88 may select one of the four inputs to the MUX 82B to output to the inverters 90A.

Furthermore, input RAN <2> 84C and input RAN <4> 84E are combined through the NAND logic gate 80G to generate an output to the MUX 82C. The input RAN <2> is also transmitted directly to the MUX 82C via bypass path 86C. The input RAN <2> 84C, input RAN <5> 84F and input RAN <8> 84I are combined through the NAND logic gate 80H to generate an output to the MUX 82C. The input RAN <2> 84C, input RAN <4> 84E, input RAN <6> 84G, and input RAN <8> 84I are combined through the NAND logic gate 80I to generate another output to the MUX 82C. The mode signal 88 selects between one of the four inputs to the MUX 82C to output to the inverters 90A of the distribution circuitry 90.

This combinational logic arrangement permits selectable control of the duty cycle of the input buffer 58. Indeed, a memory controller may control the duty cycle by selecting direct bit control (e.g., bypass mode) or by selecting summation bit (e.g., binary addition mode) control using mode signals 88 generated to operate the MUXs 82. Direct bit control corresponds to the duty cycle codes 74 output being output signals received by the MUXs 82 via bypass paths 86. Summation bit control corresponds to the duty cycle codes 74 output being output signals received by the MUXs 82 from respective logic gates 80 (e.g., "AND-ing" or operational application of AND combination logic, "NAND-ing" or operational application of NAND combination logic). The summation bit control may be based on 2-bit summation, 3-bit summation, and/or 4-bit summation based on which input to the MUXs 82 are selected. For example, an output to MUX 82A from logic gate 80B corresponds to a 3-bit summation (e.g., a first example binary addition mode), an output to MUX 82B from logic gate 80D corresponds to a 2-bit summation (e.g., a second example binary addition mode), and an output to MUX 82B from logic gate 80F corresponds to a 4-bit summation (e.g., a third example binary addition mode). Mode signals 88 respectively operate each MUX 82 in one of four operational modes, and each MUX 82 may be operated into a respective mode (e.g., different or the same as another MUX 82).

The resulting set of three bits (e.g., T<0:2>) from the respective MUXs 82 are transmitted to the input buffer 58 as the duty cycle codes 74 via distribution circuitry 90 to control the duty cycle of the input buffer 58. The distribution circuitry 90 includes enabling circuitry 90B and inverting logic 90C to help control transmission of the duty cycle codes 74 (e.g., T<0:2>) to the input buffer 58. For example, when the enabling circuitry 90B is disabled, the duty cycle codes 74 are stopped from adjusting the duty cycle of the input buffer 58. The enabling circuitry 90B may be disabled by a memory controller, such as via the signals 8 to command interface 14.

This "summation" or operational average of multiple bits from the random number generator 76 helps determine the RMS of the resulting jitter in the output Clock Out signal. Indeed, including the input buffer 58 and the duty cycle code generator 62 with a jitter generator, such as the jitter generator 48, may generate jitter having a uniform distribution jitter or jitter having a Gaussian distribution jitter, where each distribution of jitter has a controllable RMS.

Table 1 summarizes how states of the mode signals 88 change jitter outputs. It is noted that when the Mode<0> signal 88A has a logical high voltage value (e.g., "1" level), the Mode<0> signal 88A enables the enabling circuitry 90B. Q is an indicator of jitter characteristics at extreme sides of the jitter distribution, and the lower the Q value, the more frequent jitter occurs at the extremes of the jitter distribution overall (e.g., higher Q correlates to jitter at the extremes becoming less frequent).

It is noted that the input buffer 58 may be selected, or designed, to provide a jitter rated to a particular peak-to-peak value, such as 8 picoseconds (ps) peak-to-peak, and thus any suitable peak-to-peak distribution may be used. Furthermore, a cycle-to-cycle jitter may equal the peak-to-peak jitter.

TABLE 1

| Mode<0> | Mode<1> | Mode<2> | Added Jitter Characteristics |
|---|---|---|---|
| 0 | 0 | 0 | Duty cycle adjustment disabled |
| 1 | 0 | 0 | Uniform Distribution |
| 1 | 1 | 0 | Gaussian Distribution, lowest Q |
| 1 | 0 | 1 | Gaussian Distribution, mid-value Q |
| 1 | 1 | 1 | Gaussian Distribution, highest Q |

Figure 6A:
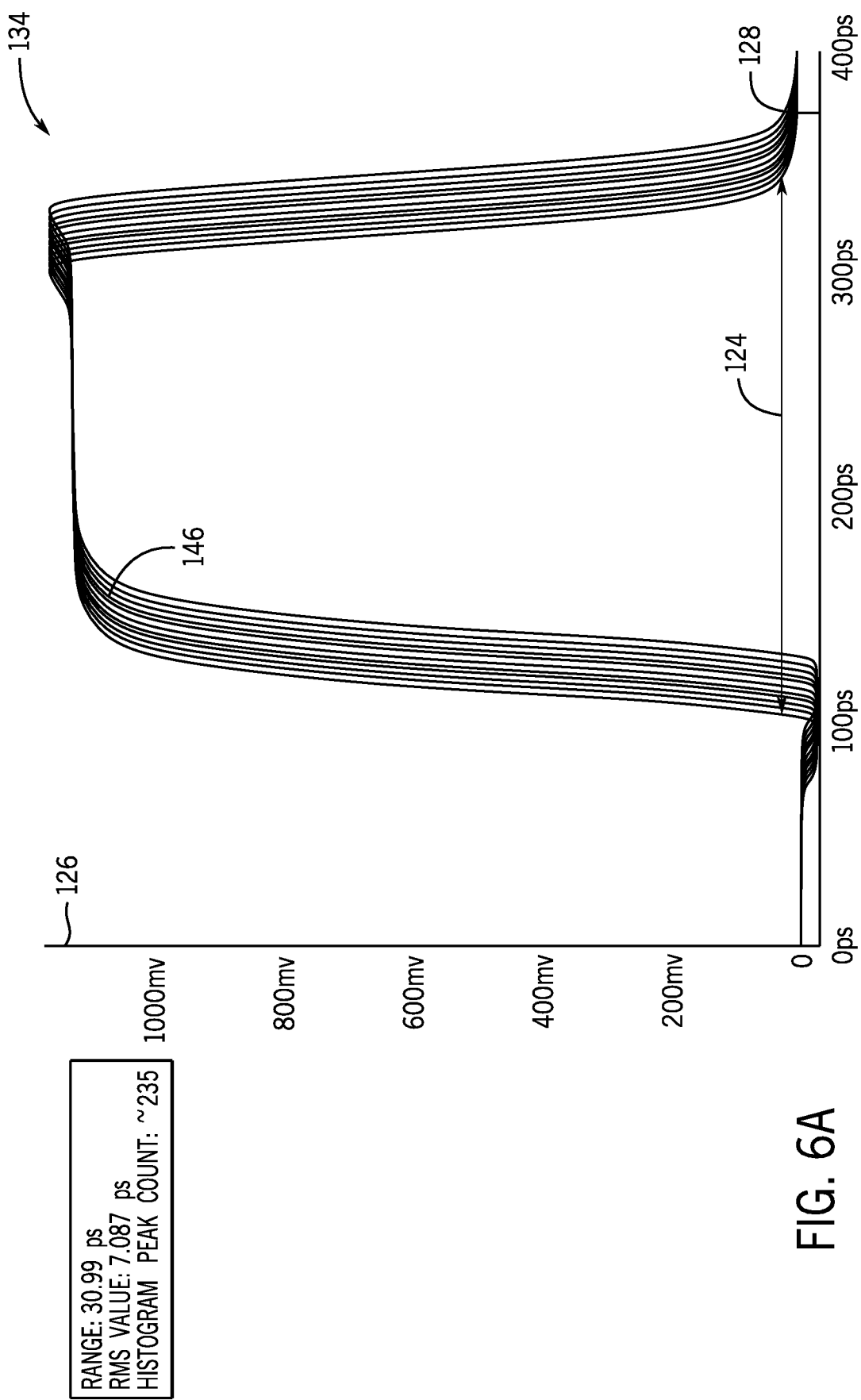
FIG. 6A is a graph of simulated operation of at least the input buffer of FIG. 2 when operated at least in part by the duty cycle code generator of FIG. 2 to add jitter characterized by a uniform distribution to an input signal, in accordance with an embodiment.
Figure 6B:
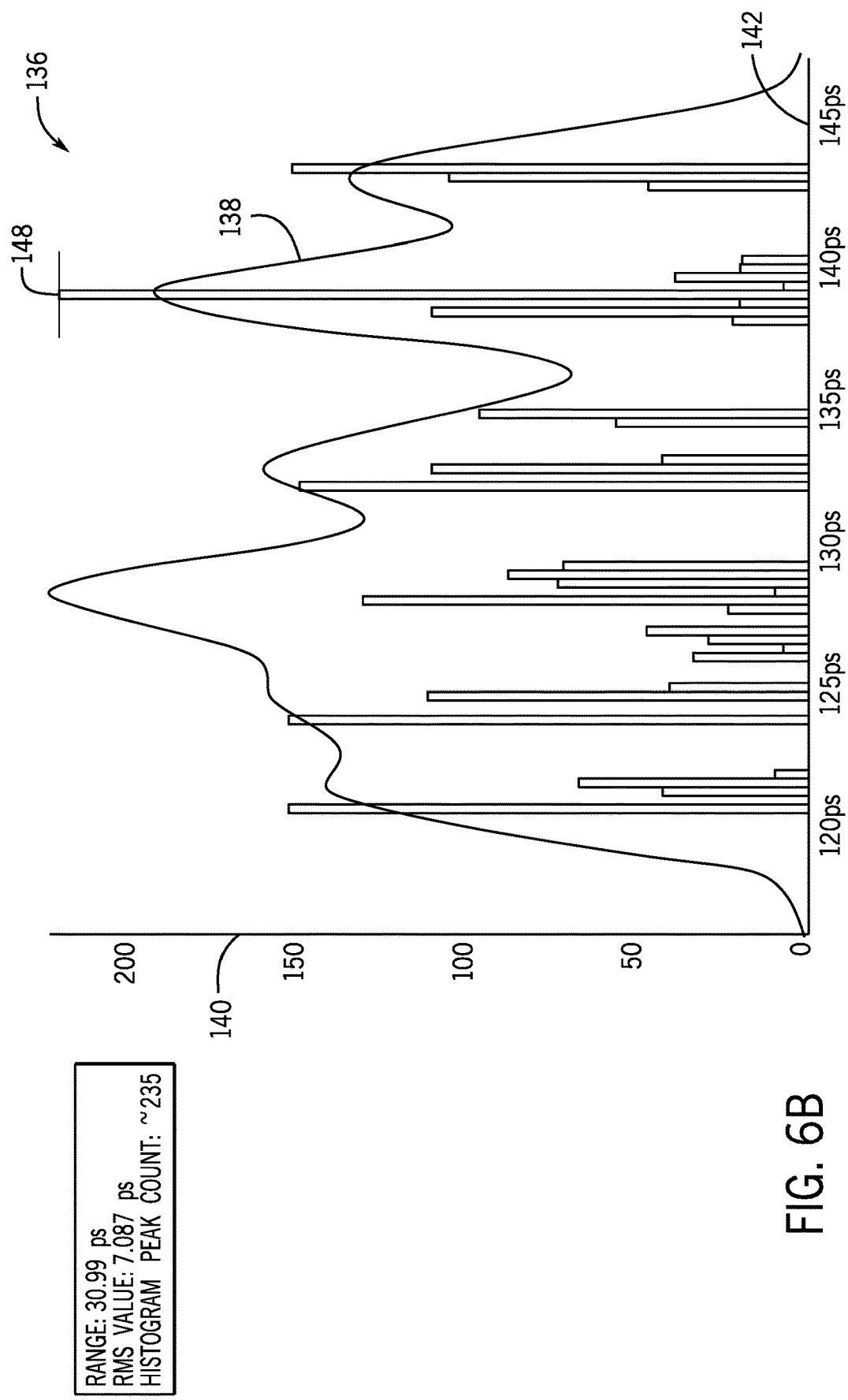
FIG. 6B is a graph of simulated operation of at least the input buffer of the jitter generator of FIG. 2 when operated at least in part by the duty cycle code generator of FIG. 2 to add the jitter characterized by a uniform distribution to the input signal, in accordance with an embodiment.
Figure 7A:
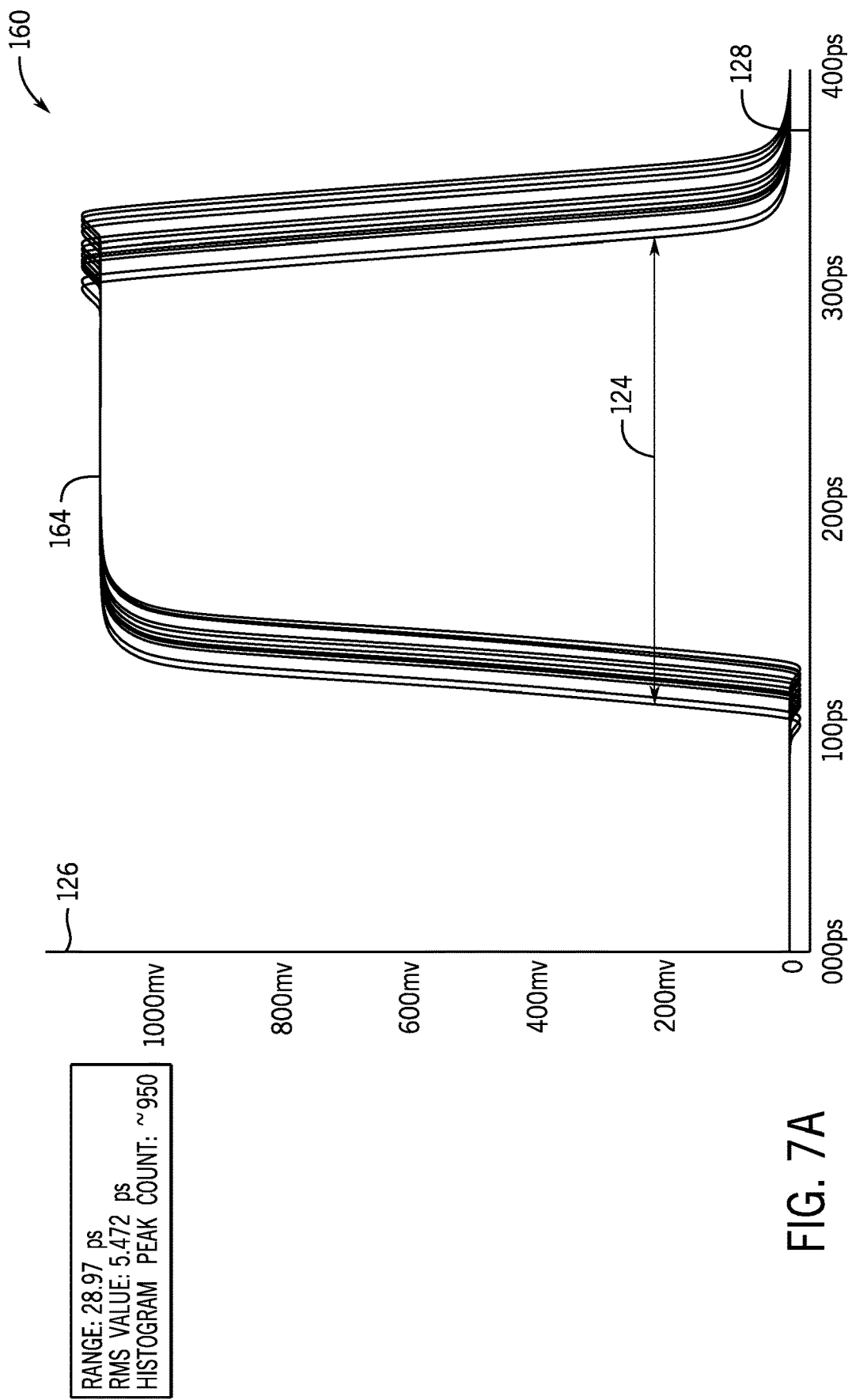
FIG. 7A is a graph of simulated operation of at least the input buffer of FIG. 2 when operated at least in part by the duty cycle code generator of FIG. 2 to add jitter characterized by a first Gaussian distribution to an input signal, in accordance with an embodiment.
Figure 7B:
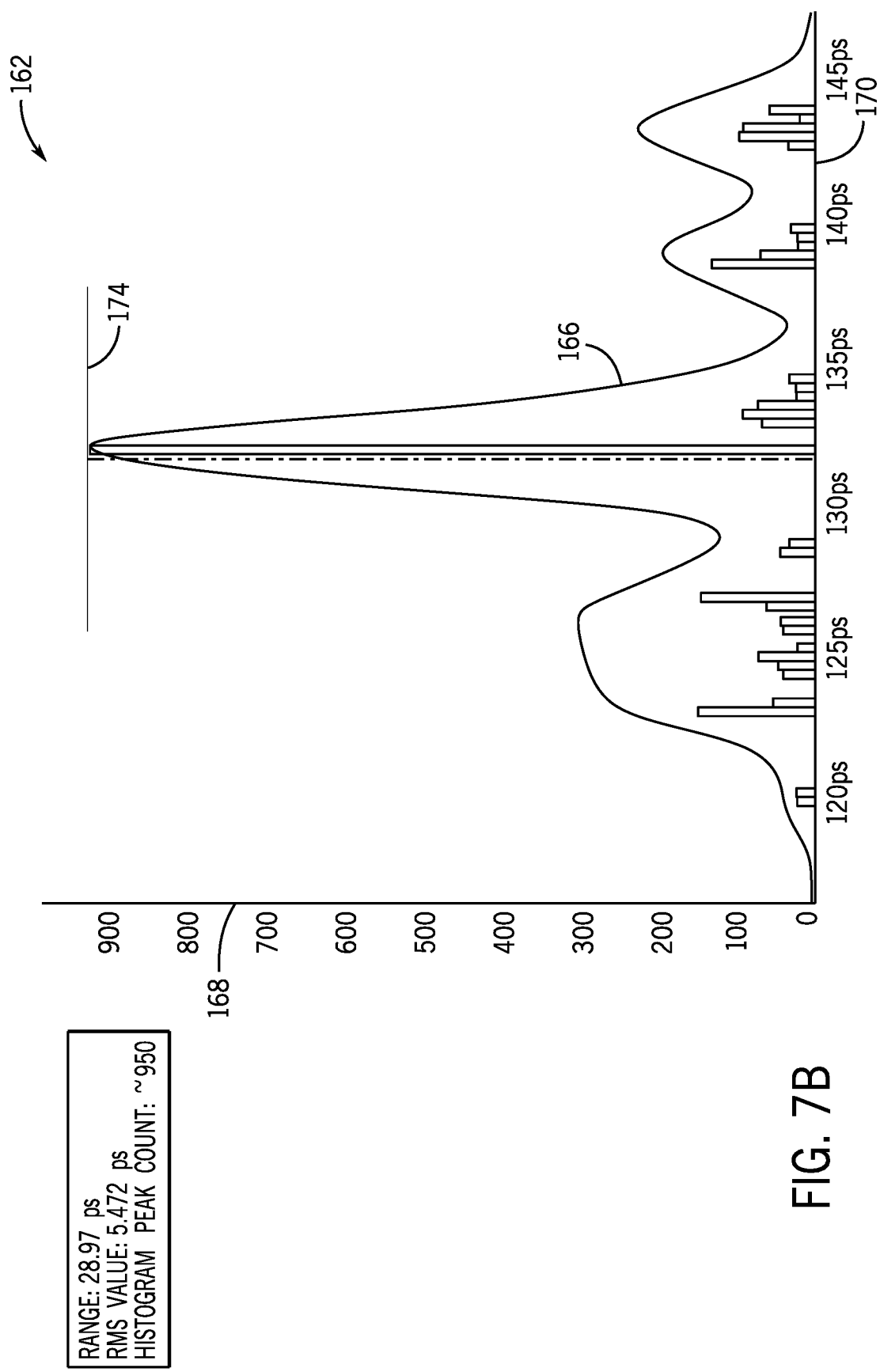
FIG. 7B is a graph of simulated operation of at least the input buffer of the jitter generator of FIG. 2 when operated at least in part by the duty cycle code generator of FIG. 2 to add the jitter characterized by a first Gaussian distribution to the input signal, in accordance with an embodiment.
Figure 8A:
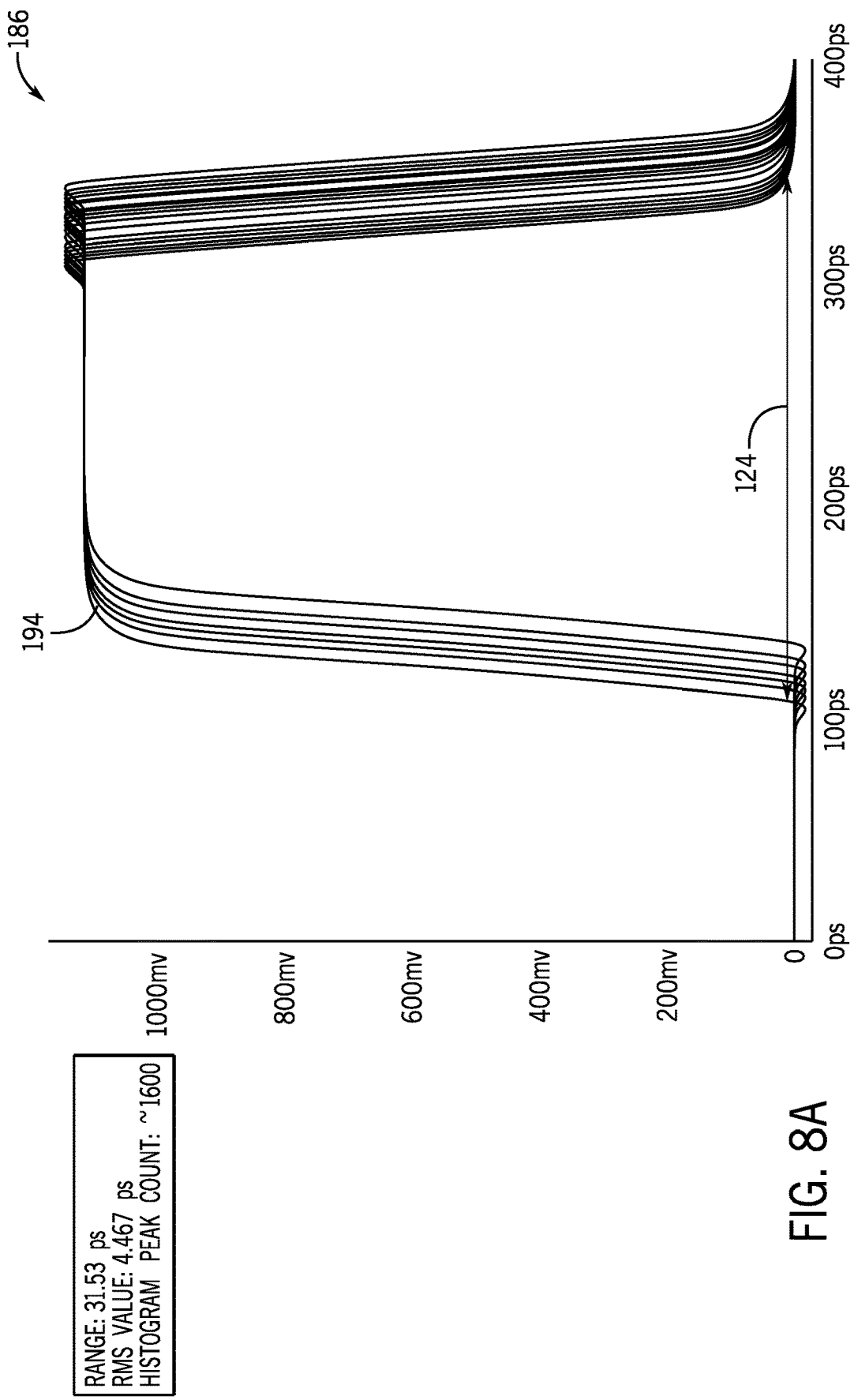
FIG. 8A is a graph of simulated operation of at least the input buffer of FIG. 2 when operated at least in part by the duty cycle code generator of FIG. 2 to add jitter characterized by a second Gaussian distribution to an input signal, in accordance with an embodiment.
Figure 8B:
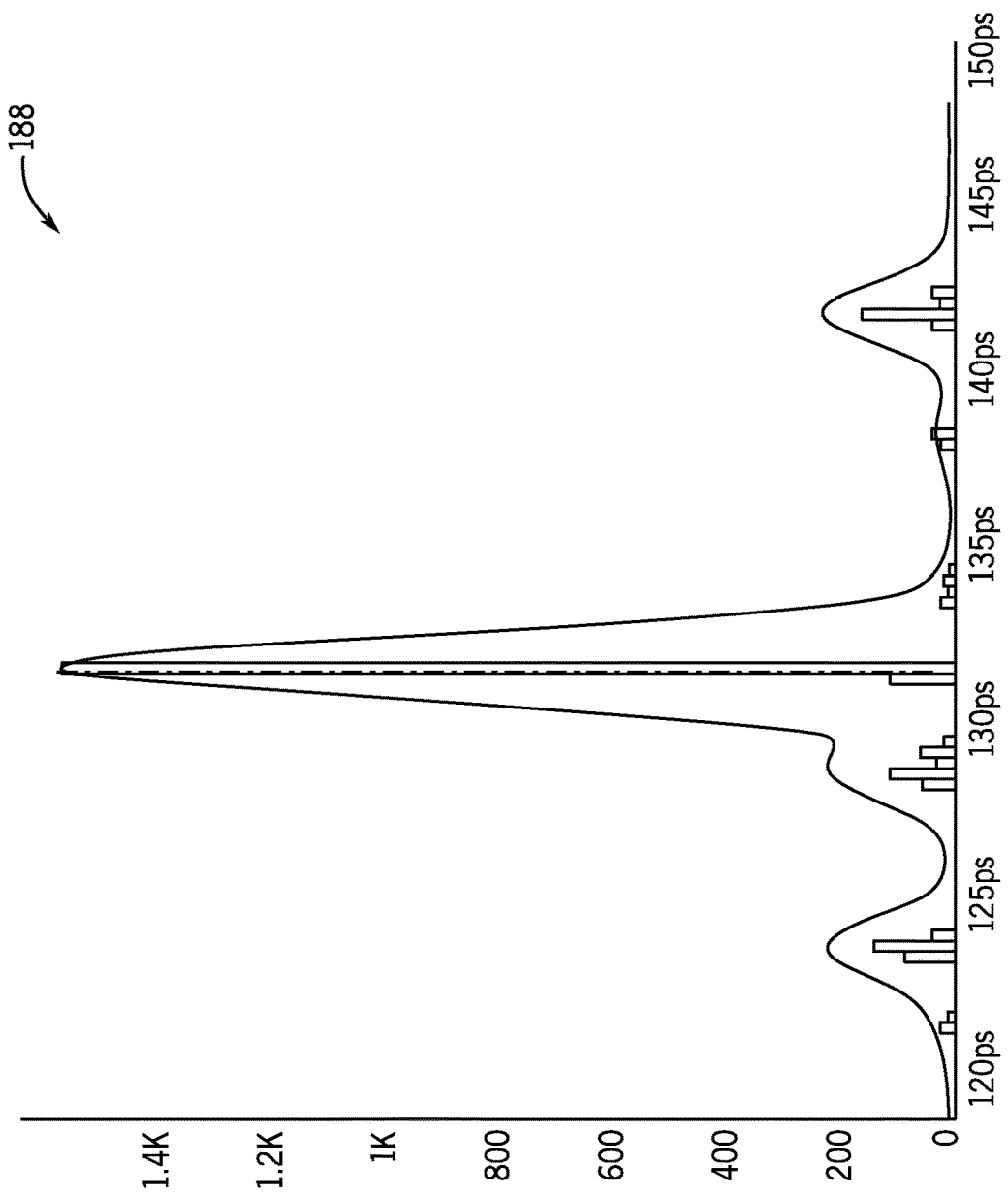
FIG. 8B is a graph of simulated operation of at least the input buffer of the jitter generator of FIG. 2 when operated at least in part by the duty cycle code generator of FIG. 2 to add the jitter characterized by a second Gaussian distribution to the input signal, in accordance with an embodiment.
Figure 9A:
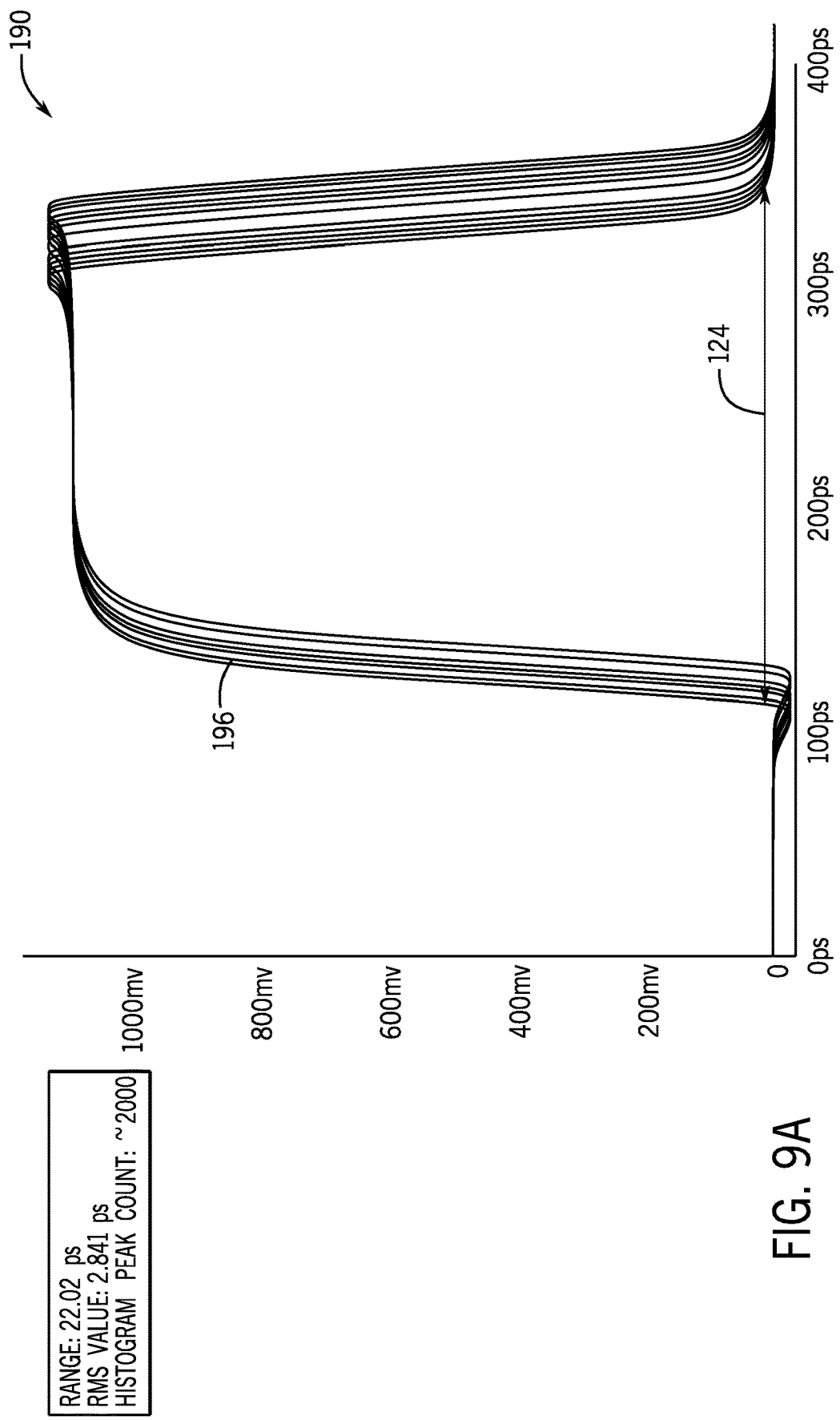
FIG. 9A is a graph of simulated operation of at least the input buffer of FIG. 2 when operated at least in part by the duty cycle code generator of FIG. 2 to add jitter characterized by a third Gaussian distribution to an input signal, in accordance with an embodiment.
Figure 9B:
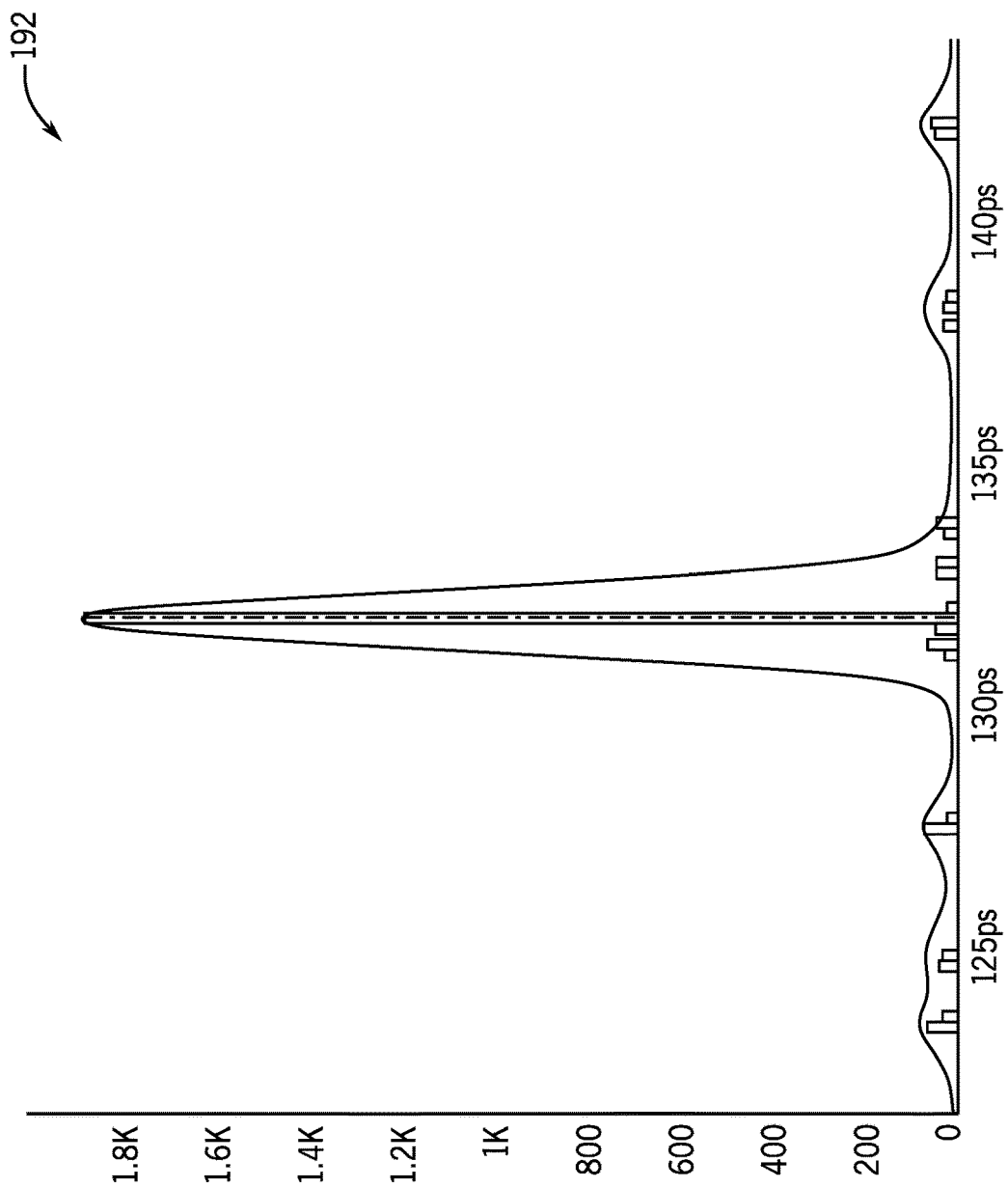
FIG. 9B is a graph of simulated operation of at least the input buffer of the jitter generator of FIG. 2 when operated at least in part by the duty cycle code generator of FIG. 2 to add the jitter characterized by a third Gaussian distribution to the input signal, in accordance with an embodiment.

When the Mode<2> signal and the Mode<1> signal both equal a low voltage level value (e.g., Mode<2>=0, Mode<1>=0) and the enabling circuitry 90B is enabled (e.g., Mode<0>=1), jitter added to the Clock In signal follows a uniform distribution is generated, as illustrated in FIGS. 6A and 6B. When the Mode<2> signal equals a low voltage level and the Mode<1> signal equals a high voltage level value (e.g., Mode<2>=0, Mode<1>=1) and the enabling circuitry 90B is enabled (e.g., Mode<0>=1), jitter added to the Clock In signal follows a Gaussian distribution having a relatively low Q is generated, as illustrated in FIGS. 7A and 7B. When the Mode<2> signal equals a high voltage levels and the Mode<1> signal equals a low voltage level value (e.g., Mode<2>=1, Mode<1>=0) and the enabling circuitry 90B is enabled (e.g., Mode<0>=1), jitter added to the Clock In signal follows a Gaussian distribution having a relatively mid-value Q is generated, as illustrated in FIGS. 8A and 8B. When both the Mode<2> signal and the Mode<1> signal equal a high voltage level value (e.g., Mode<2>=1, Mode<1>=1) and the enabling circuitry 90B is enabled (e.g., Mode<0>=1), jitter added to the Clock In signal follows a Gaussian distribution having a relatively high Q is generated, as illustrated in FIGS. 9A and 9B.

Figure 5A:
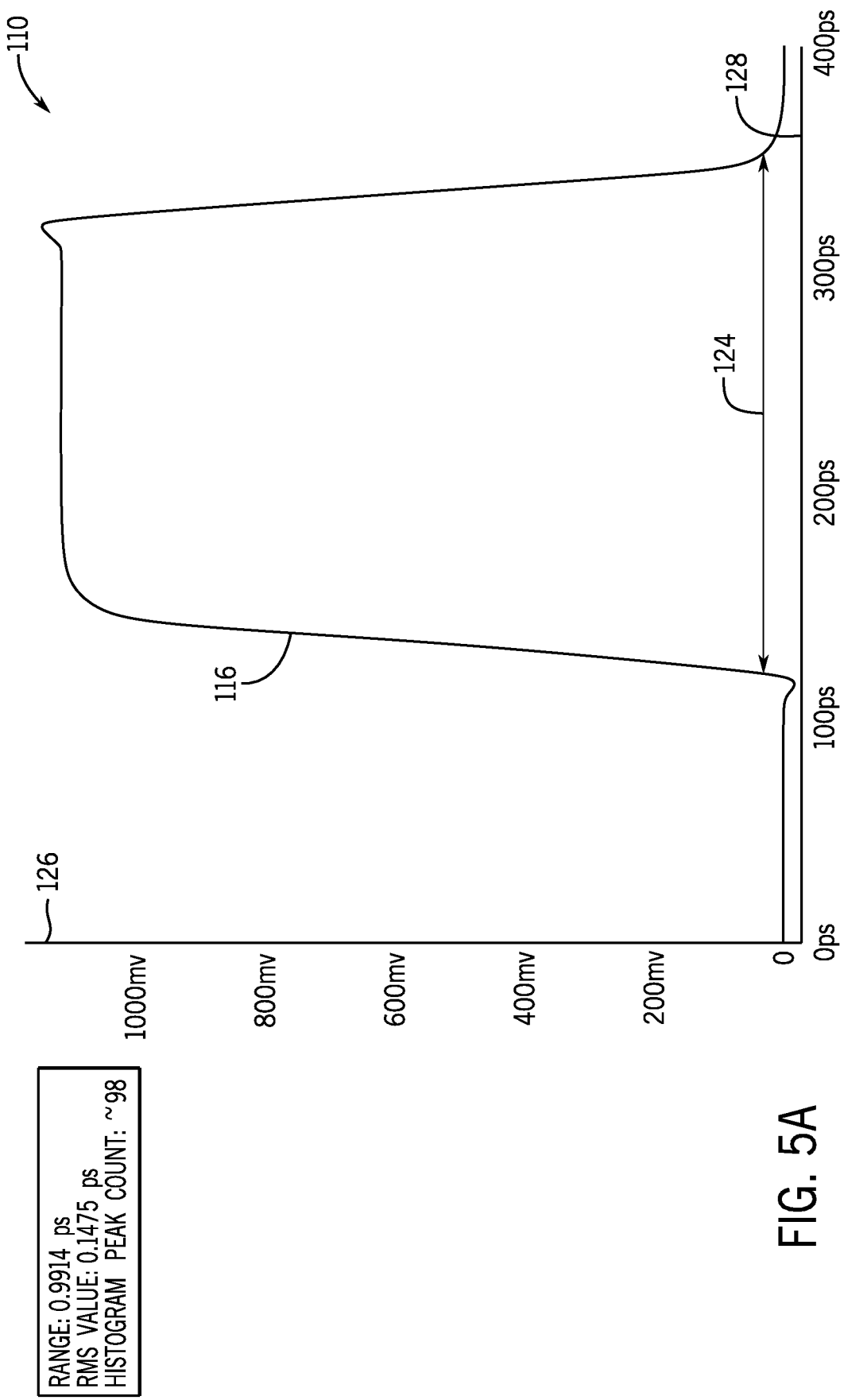
FIG. 5A is a graph of simulated operation of at least the input buffer of FIG. 2 when operated to not add jitter to an input signal, in accordance with an embodiment.
Figure 5B:
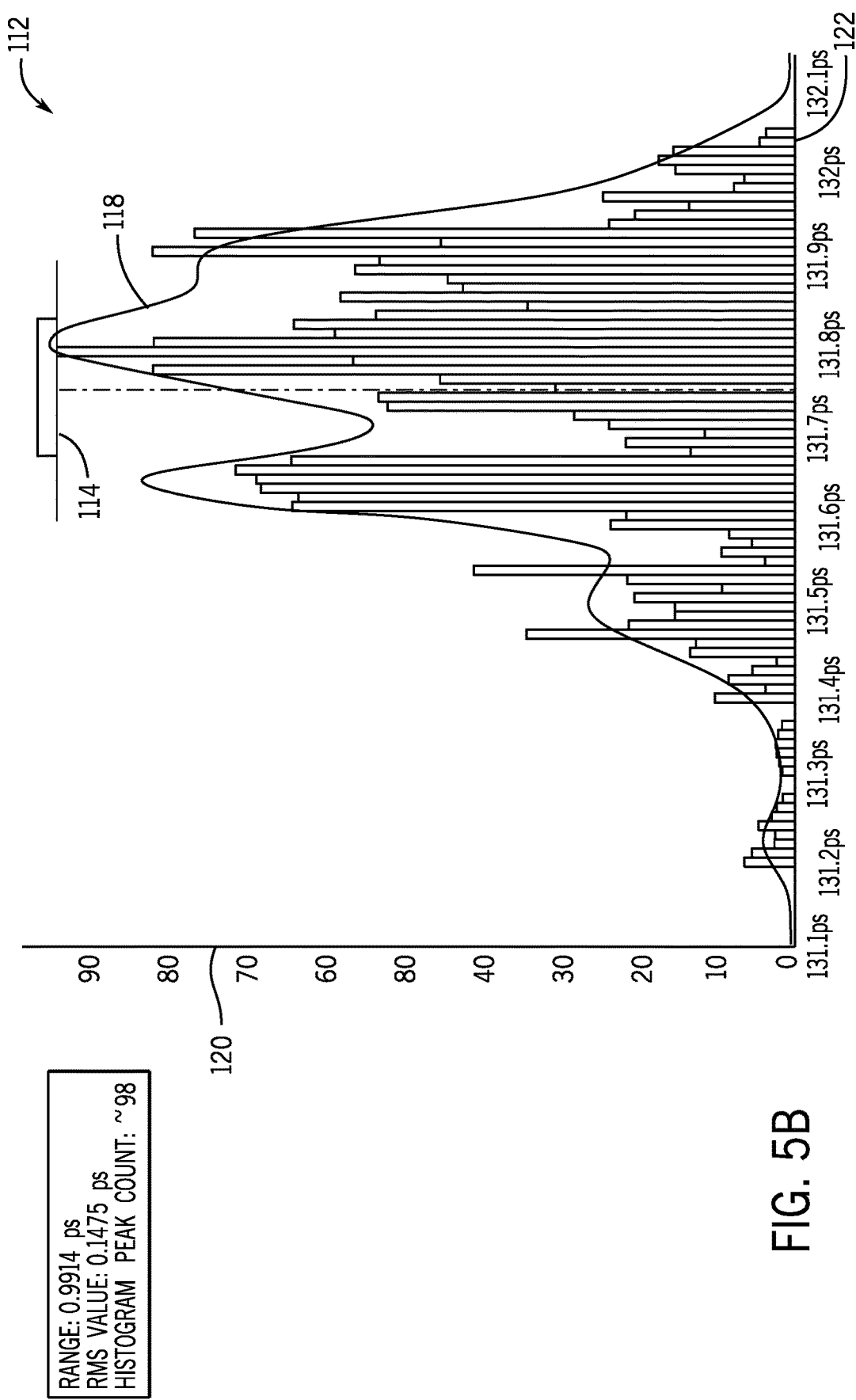
FIG. 5B is a graph of simulated operation of at least the input buffer of FIG. 2 when operated to not add jitter to the input signal, in accordance with an embodiment.

Elaborating further on Gaussian distributions of clock jitter and improvements to clock jitter generation, a trace graph 110 is depicted in FIG. 5A and a histogram graph 112 is depicted in FIG. 5B. Both FIG. 5A and FIG. 5B illustrate signal characteristics (e.g., voltage of output signal, voltage axis 126) over time (e.g., time axis 128) of an output from the input buffer 58 that has not had its duty cycle adjusted (e.g., Mode<0:2> mode signal 88 equals "000" and Mode<0>="0" disables the duty cycle adjustment of the input buffer 58 as described by Table 1). It should be understood that while a 9-bit random number provides the RAN <0:8> signals 84 of simulations illustrated in FIGS. 5A-9B, a random number may have more or less bits based on specific embodiments of the random number generator 76 and the duty cycle code generator 62. Both the trace graph 110 and the histogram graph 112 were simulated using a Clock In signal having an input swing of approximately +/−200 millivolts (mV) (e.g., a value between 190 mV and 210 mV or a suitable deviation threshold amount) and rise/fall characteristics of approximately 100 ps (e.g., a value between 90 ps and 110 ps or a suitable deviation threshold amount). The trace graph 110 shows multiple, overlaid rising and falling edges of the Clock In signal to emphasize jitter in the signal. The histogram graph 112 depicts frequency of occurrence of a particular amount of jitter, where the more frequent a particular amount of jitter appears in a simulated output from the input buffer 58 for the time period, the higher the count is in the histogram graph 112. In FIG. 5A and FIG. 5B, no jitter was added to the output from the input buffer 58. These graphs help to illustrate a control to use to compare jitter distributions illustrated in FIGS. 6A-9B. Indeed, the trace graph 110 and the histogram graph 112 illustrate a simulated clock signal having a clocking transition range of approximately 0.9914 ps (e.g., a value between 0.97 ps and 1.1 ps or a suitable deviation threshold amount) and having a root-mean-square (RMS) (e.g., sigma, standard deviation) value of approximately 0.1475 ps (e.g., a value between 0.12 ps and 0.16 ps or a suitable deviation threshold amount). The simulated output signal outputs at a maximum peak (e.g., peak 114) approximately 98 times (e.g., a value between 96 and 100 or a suitable deviation threshold amount).

The trace graph 110 shows a simulated clock output signal 116 and a distribution 118 of simulated variation in the voltage values of the clock output signal 116, where each rising edge for several cycles of transition of the clock output signal 116 are included and overlaid on each other on the trace graph 110. In this way, the jitter, or variation of the clocking signal from the ideal clocking signal caused by early and/or delayed transitioning, of the clock output signal 116 is depicted. However, a simulated clocking signal may experience relatively small variations in output timing and thus include a small, uncontrolled amount of jitter, as depicted by the distribution 118.

The histogram graph 112 highlights, in the distribution 118, frequencies of occurrences (e.g., occurrence counts represented on axis 120) of a clocking width (e.g., width represented on axis 122) of a particular amount of jitter over a period 124 of time, and the period 124 corresponds to a unit interval (UI). The histogram graph 112 illustrates that when the Clock In signal is not adjusted by the input buffer 58, the Clock In signal transmitted onto the other circuitry of the jitter generator 48 is substantially unadjusted and represents a clocking signal with no added jitter, as depicted by the relatively narrow range between values of 0.9914 ps and the relatively small RMS value of 0.1475 ps.

Comparing FIGS. 5A and 5B to FIGS. 6A and 6B highlights the differences in the Clock In signal when jitter is added to the signal. A trace graph 134 is depicted in FIG. 6A and a histogram graph 136 is depicted in FIG. 6B. Both FIG. 6A and FIG. 6B show signal characteristics over time of a signal outputted from the input buffer 58. In this simulation, the input buffer 58 has had its duty cycle adjusted according to the uniform distribution mode (e.g., Mode<0:2> mode signal 88 equals "100," where Mode<0>="1" enables the duty cycle adjustment of the input buffer 58 and Mode<1:2>="00" enables the uniform distribution mode of Table 1). Both the trace graphs 110 and 134, and the resulting histogram graphs 112 and 136, were simulated using a Clock In signal having the same or substantially similar characteristics. Similar to FIG. 5A, the trace graph 134 shows overlaid rising edges and falling edges of the clock output from the input buffer 58 to illustrate jitter in the output. Furthermore, similar to FIG. 5B, the histogram graph 136 illustrates, via line 138, frequencies of occurrences (e.g., occurrence counts represented on axis 140) of a clocking width (e.g., width represented on axis 142) particular amount jitter over a period 124 of time.

Comparing FIG. 5A to FIG. 6A and FIG. 5B to FIG. 6B, the clock output signal 116 and clock output signal 146 look similar but the clock output signal 146 has relatively large amounts of jitter, as illustrated in the variation between overlaid rising and falling edges. Indeed, the range of the clock output signal 146 is approximately 30.99 ps (e.g., a value between 28.5 ps and 32.0 ps or a suitable deviation threshold amount) and the RMS equals approximately 7.087 ps (e.g., a value between 6.5 ps and 7.5 ps or a suitable deviation threshold amount), which is greater than the range of the clock output signal 116 (e.g., range equaled approximately 0.9914 ps, RMS equaled approximately 0.1475 ps). The simulated output signal outputs at a maximum peak (e.g., peak 148) approximately 235 times (e.g., between 230 and 240 or a suitable deviation threshold amount). Thus, a controller may change jitter applied to a Clock In signal at least in part by adjusting a duty cycle of the input buffer 58 to output according to the uniform distribution mode (i.e., to output according to random numbers transmitted via bypass paths 86 to MUXs 82 based on each mode signal 88 equaling "00") before the Clock In signal is transmitted to downstream components of a jitter generator (e.g., jitter generator 48).

As described above, further control of jitter applied to the Clock In signal is possible. Indeed, FIG. 7A illustrates a trace graph 160 and FIG. 7B illustrates a histogram graph 162, which both emphasize further adjustments to signal jitter that may be made using the input buffer 58. In this simulation, the input buffer 58 has had its duty cycle adjusted according to the Gaussian Distribution, lowest Q mode (e.g., Mode<0:2> mode signal 88 equals "110," where Mode<0>="1" enables the duty cycle adjustment of the input buffer 58 and Mode<1:2>="10" enables the Gaussian Distribution, lowest Q mode of Table 1). Both the trace graphs 110, 134, and 160, and the resulting histogram graphs 112, 136 and 162, were simulated using a Clock In signal having the same or substantially similar characteristics. Similar to FIGS. 5A and 6A, the trace graph 160 shows overlaid rising edges and falling edges of clock output signal 164 (e.g., overlaid UIs) from the input buffer 58 to illustrate jitter in the output. Furthermore, similar to FIGS. 5B and 6B, the histogram graph 162 illustrates, via line 166, frequencies of occurrences (e.g., occurrence counts represented on axis 168) of a clocking width (e.g., width represented on axis 170) particular amount jitter over a period 124 of time.

Comparing FIG. 7A to FIG. 6A and FIG. 7B to FIG. 6B, the clock output signal 146 and clock output signal 164 look similar but the clock output signal 146 has relatively large amounts of jitter and the clock output signal 164 has less deviation in the amount of jitter included, as illustrated in the variation between overlaid rising and falling edges. Indeed, the range of the clock output signal 164 is approximately 28.97 ps (e.g., a value between 28.5 ps and 29.5 ps or a suitable deviation threshold amount) and the RMS equals approximately 5.472 ps (e.g., a value between 4.9 ps and 6.0 ps or a suitable deviation threshold amount), which is less than the range and RMS of the clock output signal 146 (e.g., range equaled approximately 30.99 ps, RMS equaled approximately 7.087 ps). The simulated output signal outputs at a maximum peak (e.g., peak 148) approximately 950 times (e.g., a value between 940 and 960 or a suitable deviation threshold amount), which is an increase from the clock output signal 174 histogram peak count of 235 times. Thus, a controller may change jitter applied to a Clock In signal at least in part by adjusting a duty cycle of the input buffer 58 to output according to Gaussian Distribution, lowest Q mode of Table 1 (i.e., to output according to two RAN bits summed transmitted via MUXs 82 based on each mode signal 88 equaling "10") before the Clock In signal is transmitted to downstream components of a jitter generator (e.g., jitter generator 48).

Continuing on to describe the remaining two example modes that result when three RAN bits are summed and/or when four RAN bits are summed, FIG. 8A illustrates a trace graph 186 and FIG. 8B illustrates a histogram graph 188 resulting from three RAN bits summation-based adjustments to the input buffer 58, while FIG. 9A illustrates a trace graph 190 and FIG. 9B illustrates a histogram graph 192 resulting from four RAN bits summation-based adjustments to the input buffer 58. The graphs of FIGS. 8A-9B use the same axis as FIGS. 7A and 7B and it is noted that the scale is not the same (e.g., peak count of FIG. 7B is approximately 950, peak count of FIG. 8B is approximately 1,600, such as between 1590 and 1610, and peak count of FIG. 9B is approximately 2,000, such as between 1990 and 2010). For ease of description, FIGS. 8A, 8B, 9A, and 9B are described together. For the simulation depicted in FIGS. 8A and 8B, the input buffer 58 had its duty cycle adjusted according to the Gaussian Distribution, mid-value Q (e.g., Mode<0:2> mode signal 88 equals "101," where Mode<0>="1" enables the duty cycle adjustment of the input buffer 58 and Mode<1:2>="01" enables the Gaussian Distribution, mid-value Q of Table 1) to generate simulated clock output signals 194. For the simulation depicted in FIGS. 9A and 9B, the input buffer 58 had its duty cycle adjusted according to the Gaussian Distribution, highest Q (e.g., Mode<0:2> mode signal 88 equals "111," where Mode<0>="1" enables the duty cycle adjustment of the input buffer 58 and Mode<1:2>="11" enables the Gaussian Distribution, highest Q of Table 1) to generate simulated clock output 196. Each trace graph 186, trace graph 190, histogram graph 188, and histogram graph 192 respectively plot signal characteristics of the clock output signals 194 and 196 over a same time period 124. Comparing FIG. 7A to FIG. 8A and FIG. 7B to FIG. 8B, the clock output signal 194 and clock output signal 164 look similar but the clock output signal 194 has reduced deviation in the amount of jitter included compared to the clock output signal 164, as illustrated in the variation between overlaid rising and falling edges. Comparing FIG. 9A to FIG. 8A and FIG. 9B to FIG. 8B, the clock output signal 196 has even further reduced deviation in the amount of jitter included compared to the clock output signal 194. Indeed, the clock output signal 196 is characterized by a range of approximately 22.02 ps and the RMS equals approximately 2.841 ps, which is less than the range and RMS of the clock output signal 194 (e.g., range equaled approximately 31.53 ps, RMS equaled approximately 4.467 ps), where suitable deviation thresholds of those approximations may correspond to a 5.0% or 10.0% deviation, or the like. When reviewing each of the output signal characteristics from each of the respective operational modes of the input buffer 53, it is emphasized that changing a number of RAN bits summed may be used to control the duty cycle of an input buffer 58 to drive measurable changes in RMS values of the jitter, and to further increase control over jitter in output clocking signals.

Figure 10:
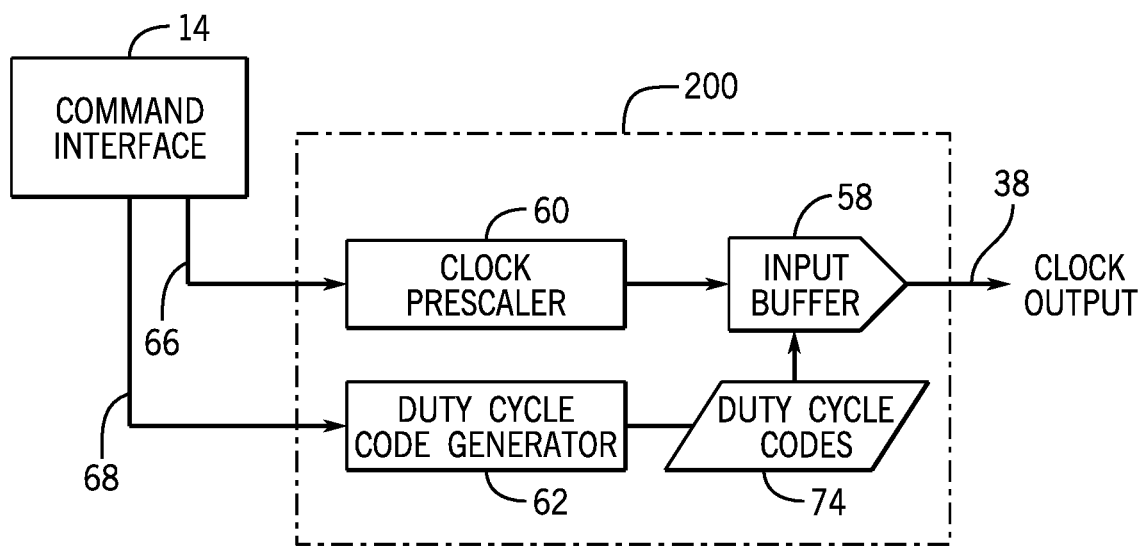
FIG. 10 is a block diagram of another example jitter generator that uses a portion of circuitry of FIG. 2, in accordance with an embodiment.
Figure 11:
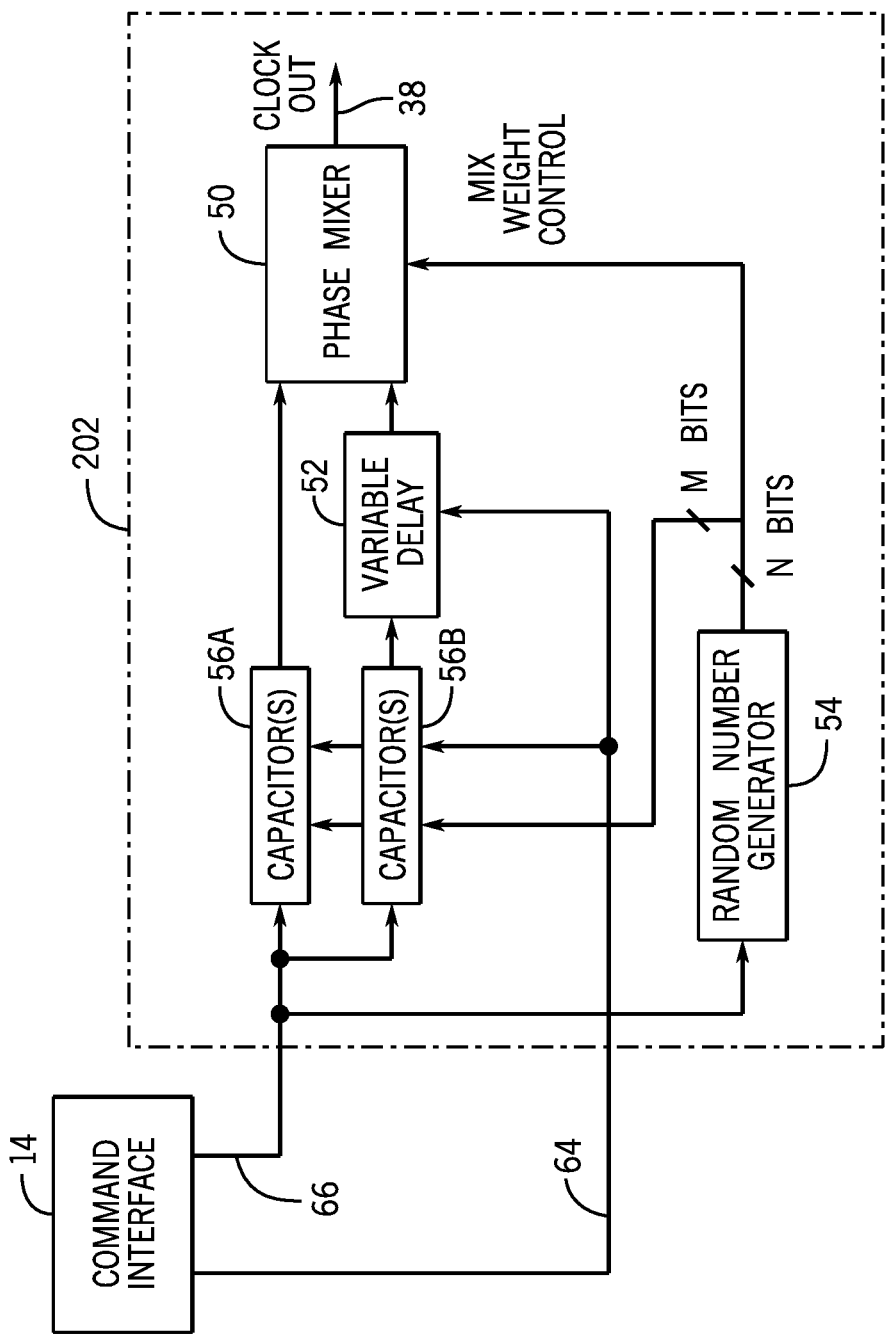
FIG. 11 is a block diagram of another example jitter generator that uses a different portion of circuitry of FIG. 2 relative to FIG. 10, in accordance with an embodiment.

Keeping the foregoing in mind, FIG. 10 and FIG. 11 depict examples of jitter generators that use respective subsets of circuitry of the jitter generator 48 shown in FIG. 2. Indeed, FIG. 10 depicts a jitter generator 200 that includes the clock prescaler 60, the duty cycle code generator 62, and the input buffer 58 described above. Using the clock prescaler 60, the duty cycle code generator 62, and the input buffer 58 in the manner described above, the jitter generator 200 outputs a clock output signal, via the path 38, for transmission to downstream circuitry without first transmitting the resulting signal from the input buffer 58 through the phase mixer 50. Indeed, the clock output signal on the path 38 from the input buffer 58 of FIG. 10 includes jitter added by the jitter generator 200 to the Clock In signal received on path 66.

Similarly, FIG. 11 depicts a jitter generator 202 that includes the capacitors 56, the variable delay block 52, the random number generator 54, and the phase mixer 50 described above. Using the capacitors 56, the variable delay block 52, the random number generator 54, and the phase mixer 50 in the manner described above, the jitter generator 202 outputs a clock output signal, via the path 38, for transmission to downstream circuitry without first receiving a clock signal output from the input buffer 58 via path 70. Indeed, the clock output signal via the path 38 from the phase mixer 50 includes jitter added by the jitter generator 202 to the Clock In signal received on path 66. FIGS. 10 and 11 illustrate that circuitry of FIG. 2 may be used together but may also be used without one another to generate a clock signal with jitter.

Operating at least a portion of the jitter generator 48, the jitter generator 200, or both, may include receiving, at a first time, a first clocking transition of an input clock signal and receiving, at a second time, a first duty cycle control signal, which programs or changes the duty cycle of the input buffer 58. The jitter generator 48 may generate or output, at a third time, a first clocking transition of an output clock signal based on the duty cycle of the input buffer 58 and the first clocking transition of the input clock signal. The jitter generator 48 may receive, after the second time, a second duty cycle control signal, which changes a duty cycle used by the input buffer 58. When the duty cycle codes 74 are generated based on the input clock signal, as opposed to a system clock, the second duty cycle control signal may be generated based at least in part on a clocking transition of the input clock signal. The jitter generator 48 may receive, after the first time, a second clocking transition of the input clock signal. The jitter generator 48 may generate, after the third time, a second clocking transition of the output clock signal based on the adjusted duty cycle of the input buffer 58 and the second clocking transition of the input clock signal. The second clocking transition of the output clock signal, at the output from the input buffer 58, may be offset in time relative to the first clocking transition of the input clock signal. Clocking intervals offset in time may refer to clocking transitions of a same continuous clock signal that have rising and falling edges that occur at different times but have a substantially similar unit interval or period 124 of time. By repeating variations of these operations with subsequent clocking transitions and subsequently generated duty cycle codes used to update the duty cycle of the input buffer 58 over time, the output clock signal transmitted from the input buffer 58 over time is the input clock signal with added jitter. The output clock signal with jitter transmitted via path 70 may be used directly in operations or may be transmitted to downstream circuitry for further processing before use (e.g., output eventually as the output clock signal on path 38).

Furthermore, the above-operations may be realized similarly by the input buffer 58, the phase mixer 50, or both. Indeed, a device, such as a jitter generator, may include code generating circuitry. The code generating circuitry, such as the duty cycle code generator 62 and/or the random number generator 54, may repeatedly generate mode data over time with different values. The values may time average to form a Gaussian distribution, a uniform distribution, or the like. Thus, driving jitter generation processes based on the mode data may create the different distributions in the jitter added to a signal. To elaborate, the code generating circuitry may generate first mode data and second mode data, where a difference between the first mode data and the second mode data corresponds to a characteristic of jitter to be added to an input clock signal. The code generating circuitry may couple to unit interval shifting circuitry. The unit interval shifting circuitry may include the input buffer 58, the phase mixer 50, the variable delay block 52, or any combination thereof, and may operate to shift respective unit intervals of different clocking transitions of an input clock signal to add jitter to the input clock signal during transmission. In this way, the unit interval shifting circuitry may receive the first mode data and a first clocking transition of the input clock signal. The unit interval shifting circuitry generates a first clocking transition of an output clock signal by shifting a unit interval characterizing the first clocking transition of the input clock signal based on the first mode data to have a different rising edge start time. For example, the first mode data and/or the second mode data may program a duty cycle of the input buffer 58, a mixing pattern used by the phase mixer 50, a delay applied by the variable delay block 52 (e.g., in a case where the first mode data includes data from the command interface 14 via path 64), or any combination thereof. The unit interval shifting circuitry may repeat the operations with a second clocking transition of the input clock signal after receiving the first clocking transition of the input clock signal and with second mode data, which programs the delay to be applied to the unit interval to a different amount. The mode data may be updated at each clocking transition of a control clock signal received by the delay circuitry, such as in response to an update to an output from the random number generator 54 and/or random number generator 76. Based on the second mode data, the unit interval shifting circuitry generates a second clocking transition of the output clock signal at least in part by shifting a unit interval characterizing the second clocking transition of the input clock signal based on the second mode data to have a different rising edge start time. The second clocking transition of the output clock signal is offset in time relative to the first clocking transition of the output clock signal when output, via path 38, to circuitry coupled downstream from the unit interval shifting circuitry. It is noted that the jitter generator 48 of FIG. 2 may be thought of as two or more (e.g., multiple) unit interval shifting circuitry coupled in series to generate a final output clock signal with jitter relative to an input clock signal received at the command interface 14.

It is noted that these methods above may be performed in combination with operations, such as receiving a mode selection signal (i.e., mode signals 88) indicative of an operational mode (e.g., receiving at the MUXs 82). As described above, a first mode selection signal may cause jitter characterized with a uniform distribution, a second mode selection signal may cause jitter characterized with a Gaussian distribution having a first root-mean-square value, and a third mode selection signal may cause jitter characterized with a Gaussian distribution having a second root-mean-square value less than the first root-mean-square value. Similarly, the different mode selection signals (e.g., mode signals 88) may cause generation of jitter having distributions with relatively different peak counts, ranges, or the like, as described with respect to FIGS. 5A-9B.

In some embodiments, some signal inputs may be electrically coupled to one or more fuses such that a particular operational mode may be permanently fixed and/or excluded from future use. In this way, an operator of testing equipment may use the host device to perform verification activities (e.g., in response to a testing instruction or command) on a memory device 10 having a jitter generator 48 on-die and after completion of the verification activities, the host device may respond by disabling the electrical coupling, for example, by destroying the fuse. Through burning of the fused electrical connection, the host device may be unable to electrically couple to one or more inputs of the jitter generator to provide one or more enable signals. As described, a host device may operate, or be operated, to permanently prevent access to changing the enable signals, to providing enable signals, and/or to providing jitter to the on-die clock as to not permit inadvertent verification during a normal operation of the memory device 10. Furthermore, by using fuses, an operator may permanently fix the input buffer 58 into a particular of the modes of Table 1, or into a mode similar to those of Table 1 (i.e., a different mode may be used with a different embodiments of the random number generator 76). It is noted that fuses may be replaced or bypassed, or include an override or restart operation to reset a state of the fuse.

Other applications may improve from usage of on-die jitter generation systems and methods. For example, in some instances, a dither circuit is used in data converting circuits. 1-bit analog-to-digital converters may benefit from adding jitter to an input signal to facilitate with the conversion. Furthermore, noise-shaping digital-to-analog conversion circuits may benefit from using added jitter to an input signal to help with filtering of unwanted signal harmonics in a spectrum of an output signal. Moreover, circuits which have an inherent hysteresis in time may benefit from adding jitter greater than the value of the inherent hysteresis. For example, a delay locked loop and/or a phase locked loop may have hysteresis to determine a state of equal phase. The addition of jitter greater than the hysteresis during a static trim procedure may improve a centering of a final trimmed state of a recovered signal. These benefits are afforded to the jitter generating circuit because this jitter generator disclosed may add amounts of jitter to a signal without changing a frequency or content of the signal, making the jitter generating circuit of particular use in digital signal application.

Accordingly, the technical effects of the present disclosure include systems and methods for creating jitter on a clocking signal to improve performance of verification activities on a memory device. The systems and methods enable a pseudo-randomly generated number to be used to randomly change a duty cycle of an input buffer that transmits an input clock signal to generate an adjusted input clock signal, which corresponds to the input clock signal having jitter. Indeed, an input buffer may output a clock output signal having jitter relative to its corresponding input clock signal at least in part by offsetting different transitions of the input clock signal based at least in part on a duty cycle of the input buffer. The input buffer may change its duty cycle in response to changes in a duty cycle control signal generated based on the pseudo-randomly generated number output. These systems and methods may be used in combination with on-die jitter generator circuitry to generate jitter on the input clock signal as an output clock signal to verify performance of a memory. Through varying a duty cycle of an input buffer to vary an amount of delay applied to each unit interval (e.g., clocking transition) of the input clock signal, a distribution of jitter may be designed. Indeed, by varying how bits of the pseudo-randomly generated number output are combined with combinational logic, the distribution of jitter may be designed to have a particular root-mean-square (RMS) value (e.g., specific value, performance that satisfies a specific range of values). Using these systems and methods to customize a RMS value of a jitter distribution to the application in combination with on-die jitter generation systems and methods may improve memory device technology by enabling verification activities at a variety of stages during and after manufacturing.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
a command interface; and
a jitter generator coupled to the command interface, comprising:
  a duty cycle code generator configured to:
    receive a mode signal from the command interface, wherein the mode signal indicates an operational mode; and
    generate a duty cycle control signal based on the operational mode; and
  an input buffer coupled to the duty cycle code generator and configured to have a first duty cycle at a first time, wherein the input buffer is configured to:
    receive a first clock signal from the command interface at the first time;
    receive the duty cycle control signal from the duty cycle code generator;
    in response to the duty cycle control signal, adjust the first clock signal to include jitter at least in part by changing the first duty cycle to a second duty cycle based on the duty cycle control signal while transmitting the first clock signal; and
    output the adjusted first clock signal.

2. The device of claim 1, wherein the duty cycle code generator comprises a switching network configured to be operated in one of a plurality of operational modes in response to the mode signal.

3. The device of claim 2, wherein the switching network comprises combinational logic configured to generate a plurality of inputs to multiplexing circuitry, wherein the multiplexing circuitry is configured to selectively transmit a subset of the plurality of inputs as the duty cycle control signal selected based at least in part on a state of the mode signal.

4. The device of claim 1, wherein the duty cycle code generator comprises:
a random number generator configured to generate a pseudo-random number output; and
delay-causing circuitry configured to delay the pseudo-random number output before transmitting the pseudo-random number output.

5. The device of claim 4, wherein the random number generator comprises a plurality of flip-flops and an exclusive-OR logic gate configured to generate the pseudo-random number output at least in part by outputting a plurality of bits indicative of a count.

6. The device of claim 5, wherein the random number generator is configured to change the pseudo-random number output in response to a rising edge of the first clock signal, and wherein a change in the pseudo-random number output triggers a change in the duty cycle control signal.

7. The device of claim 1, wherein the jitter generator comprises a clock prescaler configured to modify the first clock signal before the first clock signal is transmitted from the command interface to the input buffer.

8. The device of claim 1, wherein the jitter generator comprises a phase mixer, a delay block, and one or more capacitors, wherein the phase mixer is configured to receive a second clock signal generated based on the adjusted first clock signal from the one or more capacitors and a delayed second clock signal, wherein the delay block delays the second clock signal to generate the delayed second clock signal, and wherein the phase mixer is configured to output a third clock output signal comprising the adjusted first clock signal adjusted with additional jitter.

9. The device of claim 1, wherein the jitter generator is configured to output the adjusted first clock signal to a command decoder, a delay locked loop, an input/output interface, or any combination thereof.

10. The device of claim 1, wherein the command interface is configured to receive the mode signal from a memory controller operating in response to a testing instruction.

11. A jitter generator, comprising:
a duty cycle code generator comprising a random number generator, wherein the duty cycle code generator is configured to generate a duty cycle control signal based on an output from the random number generator; and
an input buffer being characterized with a tunable duty cycle, wherein the input buffer is coupled to the duty cycle code generator and to a source of an input clock signal, wherein the input buffer is configured to:
receive the duty cycle control signal from the duty cycle code generator;
receive the input clock signal from the source; and
output an output clock signal including jitter relative to the input clock signal at least in part by adjusting respective clocking transitions of the input clock signal based at least in part on the tunable duty cycle, and wherein the input buffer is configured to tune the tunable duty cycle in response to the duty cycle control signal.

12. The jitter generator of claim 11, wherein the random number generator is configured to output a plurality of bits comprising a least significant bit, wherein the output of the plurality of bits changes in response to a rising clock edge, wherein the duty cycle code generator comprises:
distribution circuitry; and
a switching network coupled between the random number generator and the distribution circuitry.

13. The jitter generator of claim 12, wherein the switching network is configured to be operated in a bypass mode in response to a mode signal received from a command interface, wherein the bypass mode causes the switching network to transmit the least significant bit to the distribution circuitry, and wherein the jitter is characterized as a uniform jitter distribution in response to the switching network being operated in the bypass mode.

14. The jitter generator of claim 12, wherein the switching network is configured to be operated in a binary addition mode in response to a mode signal received from a command interface, wherein the binary addition mode causes the switching network to transmit a subset of combinational logic output signals to the distribution circuitry, and wherein the jitter is characterized as a Gaussian jitter distribution in response to the switching network being operated in the binary addition mode.

15. The jitter generator of claim 11, wherein the duty cycle code generator comprises combinational logic configured to generate a plurality of inputs, wherein the duty cycle code generator is configured to selectively transmit a subset of the plurality of inputs as the duty cycle control signal.

16. The jitter generator of claim 11, wherein the duty cycle code generator comprises:
a random number generator configured to generate a plurality of signals indicative of a number; and
delay-causing circuitry configured to delay the plurality of signals before the duty cycle code generator transmits a subset of the plurality of signals as the duty cycle control signal.

17. A method, comprising:
receiving a first clocking transition of an input clock signal;
generating, using an input buffer having a first duty cycle, a first clocking transition of an output clock signal based on the first duty cycle and the first clocking transition of the input clock signal;
receiving a second clocking transition of the input clock signal after receiving the first clocking transition of the input clock signal;
receiving a mode selection signal indicative of an operational mode selected from a plurality of operational modes;
changing the first duty cycle to a second duty cycle based on the mode selection signal; and
generating, using the input buffer having the second duty cycle, a second clocking transition of the output clock signal based on the second duty cycle and the second clocking transition of the input clock signal, wherein the second clocking transition of the output clock signal is offset in time relative to the first clocking transition of the input clock signal, and wherein the output clock signal comprises the input clock signal with jitter.

18. The method of claim 17, comprising:
generating a duty cycle control signal based at least in part on the mode selection signal to trigger the first duty cycle to change to the second duty cycle, wherein the mode selection signal comprises receiving one of: a first mode selection signal configured to cause the jitter to be characterized with a uniform distribution, a second mode selection signal configured to cause the jitter to be characterized with a Gaussian distribution having a first root-mean-square value, or a third mode selection signal configured to cause the jitter to be characterized with a Gaussian distribution having a second root-mean-square value less than the first root-mean-square value.

19. The method of claim 17, comprising:
generating a duty cycle control signal in response to a number generator receiving the input clock signal; and
transmitting the duty cycle control signal to the input buffer to trigger the first duty cycle to change to the second duty cycle.

20. The method of claim 17, comprising:
transmitting the output clock signal to a variable capacitor and a delay block, wherein the output clock signal is characterized with additional jitter after being output from the variable capacitor and the delay block.

21. A device, comprising:
code generating circuitry configured to generate first mode data and second mode data, wherein a difference between the first mode data and the second mode data corresponds to a characteristic of jitter to be added to an input clock signal having a plurality of clocking transitions;

unit interval shifting circuitry configured to:
   receiving the first mode data and a first clocking transition of the input clock signal from additional unit interval shifting circuitry;
   generating a first clocking transition of an output clock signal at least in part by shifting the first clocking transition of the input clock signal based on the first mode data;
   receiving a second clocking transition of the input clock signal from the additional unit interval shifting circuitry after receiving the first clocking transition of the input clock signal;
   receiving the second mode data; and
   generating a second clocking transition of the output clock signal at least in part by shifting the second clocking transition of the input clock signal based on the second mode data, wherein the second clocking transition of the output clock signal is offset in time relative to the first clocking transition of the output clock signal.

22. The device of claim 21, wherein the unit interval shifting circuitry comprises a phase mixer, an input buffer, or both.

23. The device of claim 21, wherein the first mode data and the second mode data are generated at different times by one or more random number generators.

24. A jitter generator, comprising:
   a duty cycle code generator configured to generate a duty cycle control signal, wherein the duty cycle code generator comprises:
      a random number generator configured to output a plurality of bits comprising a least significant bit, wherein the output of the plurality of bits changes in response to a rising clock edge;
      distribution circuitry; and
      a switching network coupled between the random number generator and the distribution circuitry; and
   an input buffer coupled to the duty cycle code generator and to a source of an input clock signal, wherein the input buffer is configured to output an output clock signal having jitter relative to the input clock signal in response to the duty cycle control signal.

* * * * *